US009627530B2

(12) United States Patent
Liu et al.

(10) Patent No.: US 9,627,530 B2
(45) Date of Patent: Apr. 18, 2017

(54) SEMICONDUCTOR COMPONENT AND METHOD OF MANUFACTURE

(71) Applicant: Semiconductor Components Industries, LLC, Phoenix, AZ (US)

(72) Inventors: Chun-Li Liu, Scottsdale, AZ (US); Balaji Padmanabhan, Tempe, AZ (US); Ali Salih, Mesa, AZ (US); Peter Moens, Zottegem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/452,222

(22) Filed: Aug. 5, 2014

(65) Prior Publication Data

US 2016/0043219 A1  Feb. 11, 2016

(51) Int. Cl.
*H01L 21/02* (2006.01)
*H01L 29/78* (2006.01)
(Continued)

(52) U.S. Cl.
CPC ........ *H01L 29/7827* (2013.01); *H01L 21/743* (2013.01); *H01L 21/746* (2013.01);
(Continued)

(58) Field of Classification Search
CPC ............. H01L 29/2003; H01L 29/7787; H01L 29/205; H01L 29/66462; H01L 29/42316;
(Continued)

(56) References Cited

U.S. PATENT DOCUMENTS 8,216,367 B2   7/2012 Udagawa
2008/0023706 A1*  1/2008 Saito et al. .............. 257/76
(Continued)

FOREIGN PATENT DOCUMENTS

EP    0746040 A1   12/1996

OTHER PUBLICATIONS

Hidekazu Umeda, Asamira Suzuki, Yoshiharu Anda, Masahiro Ishida, Tetsuzo Udea, Tsuyoshi Tanaka, Daisuke Ueda, Blocking-Voltage Boosting Technology for GaN Transistors by Widening Depletion Layer in Si Substrates, Electron Devices Meeting (IEDM), Dec. 6-8, 2010, pp. 20.5.1-20.5.4, vol. 10-480, IEEE.
(Continued)

*Primary Examiner* — Natalia Gondarenko
(74) *Attorney, Agent, or Firm* — Rennie William Dover

(57) ABSTRACT

In accordance with an embodiment, a method for manufacturing a semiconductor component includes forming a first trench through a plurality of layers of compound semiconductor material. An insulating material is formed on first and second sidewalls of the first trench and first and second sidewalls of the second trench and a trench fill material is formed in the first and second trenches. In accordance with another embodiment, the semiconductor component includes a plurality of layers of compound semiconductor material over a body of semiconductor material and first and second filled trenches extending into the plurality of layers of compound semiconductor material. The first trench has first and second sidewalls and a floor and a first dielectric liner over the first and second sidewalls and the second trench has first and second sidewalls and a floor and second dielectric liner over the first and second sidewalls of the second trench.

12 Claims, 19 Drawing Sheets

(51) Int. Cl.
*H01L 21/762* (2006.01)
*H01L 29/417* (2006.01)
*H01L 21/768* (2006.01)
*H01L 29/66* (2006.01)
*H01L 21/74* (2006.01)
*H01L 21/76* (2006.01)
*H01L 29/778* (2006.01)
H01L 29/20 (2006.01)
H01L 29/06 (2006.01)
H01L 29/10 (2006.01)

(52) U.S. Cl.
CPC .... *H01L 21/7605* (2013.01); *H01L 21/76224* (2013.01); *H01L 21/76898* (2013.01); *H01L 29/4175* (2013.01); *H01L 29/66318* (2013.01); *H01L 29/66462* (2013.01); *H01L 29/66666* (2013.01); *H01L 29/7786* (2013.01); *H01L 29/0649* (2013.01); *H01L 29/1075* (2013.01); *H01L 29/2003* (2013.01)

(58) Field of Classification Search
CPC ............... H01L 29/4236; H01L 29/475; H01L 29/7783; H01L 2924/12032; H01L 2924/13055; H01L 2924/13091; H01L 21/02505; H01L 21/02631; H01L 21/02458; H01L 29/15; H01L 29/78; H01L 29/7802; H01L 29/7786; H01L 2924/1305; H01L 2924/1309; H01L 24/83; H01L 2933/0016; H01L 33/007; H01L 33/0025; H01L 33/0075; H01L 33/0066; H01L 33/32; H01L 2224/03; H01L 2224/0345; H01L 2224/03622; H01L 2224/05124; H01L 2224/45124; H01L 2224/73265; H01L 2224/92242; H01L 25/18; H01L 21/76898; H01L 21/0254; H01L 21/0217; H01L 21/02178; H01L 21/28575; H01L 21/76224; H01L 29/66666; H01L 29/0649; H01L 29/41741
USPC ................... 438/253, 427, 172; 257/76, 329
See application file for complete search history.

(56) References Cited

U.S. PATENT DOCUMENTS

| | | | |
|---|---|---|---|
| 2008/0290448 A1* | 11/2008 | Tilke et al. | 257/513 |
| 2009/0045438 A1* | 2/2009 | Inoue et al. | 257/192 |
| 2010/0244112 A1* | 9/2010 | Voldman | 257/301 |
| 2011/0133251 A1 | 6/2011 | He | |
| 2013/0069208 A1 | 3/2013 | Briere | |
| 2013/0099324 A1 | 4/2013 | Huang et al. | |
| 2013/0146893 A1 | 6/2013 | Thei et al. | |
| 2013/0256699 A1* | 10/2013 | Vielemeyer et al. | 257/77 |
| 2014/0091314 A1* | 4/2014 | Ishiguro et al. | 257/76 |
| 2014/0183621 A1* | 7/2014 | Gamerith et al. | 257/329 |
| 2014/0252366 A1* | 9/2014 | Gao | H01L 29/2003 257/76 |
| 2015/0014696 A1* | 1/2015 | Chen et al. | 257/76 |
| 2015/0029627 A1* | 1/2015 | Mauder | H01L 29/7397 361/87 |

OTHER PUBLICATIONS

Silvia Lenci, Brice de Jaeger, Laureen Carbonell, Jie Hu, Geert Mannaert, Dirk Wellekens, Shuzhen You, Benoit Bakeroot, Stefaan Decoutere, Au-Free AlGaN/GaN Power Diode on 8-in Si substrate with Gated Edge Termination ,IEEE Electron Device Letters, Aug. 2013, pp. 1035-1037, vol. 34, No. 8, IEEE.

\* cited by examiner

SEMICONDUCTOR COMPONENT AND METHOD OF MANUFACTURE

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs), High Electron Mobility Transistors (HEMTs), etc. Devices such as diodes, Schottky diodes, and FETs were typically manufactured from a silicon substrate. Drawbacks with silicon based semiconductor devices include low breakdown voltages, excessive reverse leakage current, large forward voltage drops, unsuitably low switching characteristics, high power densities, and high costs of manufacture. To overcome these drawbacks, semiconductor manufacturers have turned to manufacturing semiconductor devices from compound semiconductor substrates such as, for example, III-N semiconductor substrates, III-V semiconductor substrates, II-VI semiconductor substrates, etc. Although these substrates have improved device performance, they are fragile and add to manufacturing costs.

Typically, compound semiconductor substrates are comprised of a plurality of layers of semiconductor material. For example, a compound semiconductor substrate may include a substrate layer, a nucleation layer, a buffer layer, a channel layer, and a strained layer. A drawback with these structures is that donors at the interfaces between the layers increases the leakage current by orders of magnitude. In embodiments in which the substrate layer is silicon, an inversion channel at the interface of the silicon and the nucleation layer causes leakage to the sidewalls of the semiconductor die. A III-N compound semiconductor material that includes an isolation implant to reduce leakage currents caused by metal contacting the peripheral edges of a semiconductor die has been described in U.S. Patent Application Publication Number 2013/0099324 A1 by Jenn Hwa Huang et al. and published on Apr. 25, 2013.

Accordingly, it would be advantageous to have a structure and method for manufacturing a semiconductor component to inhibit leakage currents and to improve the performance and manufacturability of semiconductor components manufactured from compound semiconductor substrates. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
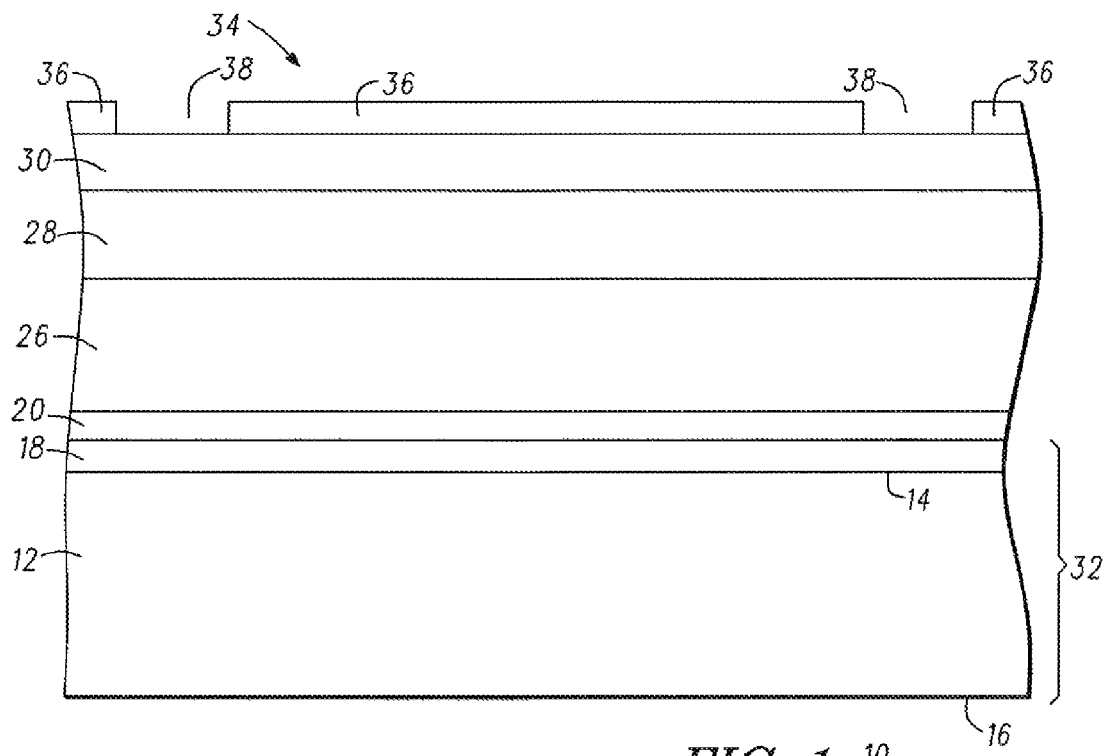
FIG. 1 is a cross-sectional view of a semiconductor component during manufacture in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally, the present invention provides a semiconductor component and a method for manufacturing a semiconductor component comprising providing a semiconductor material having a surface and forming a field stop layer on the semiconductor material. A first layer of III-nitride material is formed on the field stop layer and a plurality of trenches are formed, wherein each trench extends through the first layer of III-nitride material, the electric field stop layer, and into the body of semiconductor material, and wherein each trench has a floor and opposing sidewalls. A layer of insulating material is formed on at least the opposing sidewalls of a first trench of the plurality of trenches, on the opposing sidewalls of a second trench of the plurality of trenches, and on the floor of the second trench of the plurality of trenches, and a trench fill material is formed in the first trench and in the second trench.

In accordance with another embodiment, providing the semiconductor material includes providing a body of semiconductor material, and forming a nucleation layer on the body of semiconductor material.

In accordance with another embodiment, a second layer of III-nitride semiconductor material is formed over the nucleation layer and an electric field stop layer is formed on the second layer of III-nitride semiconductor material.

In accordance with another embodiment, the field stop layer is formed to be in contact with the semiconductor material and the III-nitride semiconductor material is formed to be in contact with the electric field stop layer.

In accordance another embodiment, forming a layer of insulating material on the opposing sidewalls of a first trench and on the opposing sidewalls of a second trench includes forming one of aluminum nitride or silicon nitride on the opposing sidewalls of the first trench and on the opposing sidewalls of the second trench.

In accordance with another embodiment, one of an electrically conductive material or an electrically insulating material is formed in the first trench and in the second trench.

In accordance with another embodiment, an electrically conductive material is formed in the first trench, wherein the electrically conductive material contacts the semiconductor material.

In accordance with another embodiment, the layer of insulating material is formed on the floor of the first trench.

In accordance with another embodiment, one of aluminum nitride or silicon nitride is formed on the floors and on the opposing sidewalls of the first trench and the second trench.

In accordance with another embodiment, the body of semiconductor material is selected from the group of semiconductor materials comprising silicon, silicon nitride, gallium nitride, and sapphire.

In accordance with another embodiment, a control electrode and first and second current carrying electrodes are formed over the strained layer and an electrical interconnect is formed between one of the first current carrying electrode or the second current carrying electrode and the trench fill material in the first trench.

In accordance with another embodiment, a method for manufacturing a semiconductor component is provided that includes: providing a semiconductor material, forming an electric field stop layer over the semiconductor material; forming a plurality of layers of compound semiconductor material on the electric field stop layer; forming a first trench through the plurality of layers of compound semiconductor material and the field stop layer, the first trench having first and second sidewalls and a floor; forming a second trench through the plurality of layers of compound semiconductor material and the field stop layer, the second trench having first and second sidewalls and a floor; forming an insulating material on the first and second sidewalls of the first trench and the floor and first and second sidewalls of the second trench; forming a trench fill material in the first and second trenches; and forming a control electrode and first and second current carrying electrodes over the plurality of layers of compound semiconductor material that are between the first and second trenches.

In accordance with another embodiment, a body of semiconductor material is provided and a nucleation layer is formed on the body of semiconductor material.

In accordance with another embodiment, the electric field stop layer is formed between and in contact with the body of semiconductor material and a first layer of the plurality of layers of compound semiconductor material.

In accordance with another embodiment, a trench fill material is formed in the first and second trenches by forming one of a doped polysilicon or an oxide in the first and second trenches.

In accordance with another embodiment, the semiconductor material is grounded.

In accordance with another embodiment, a trench fill material is formed in a first trench, wherein the trench fill material comprises doped polysilicon that contacts the body of semiconductor material.

In accordance with another embodiment, one of the first current carrying electrode or the second current carrying electrode is coupled to the trench fill material in the first trench.

In accordance with another embodiment, a semiconductor component comprises a semiconductor material; an electric field stop material formed on the semiconductor material; a plurality of layers of compound semiconductor material over the electric field stop layer; first and second filled trenches extending into the plurality of layers of compound semiconductor material and the electric field stop layer, wherein the first trench has first and second sidewalls and a floor and a first dielectric liner over the first and second sidewalls and wherein the second trench has first and second sidewalls and a floor and a second dielectric liner over the first and second sidewalls of the second trench; and a source electrode, a drain electrode, and a gate electrode over the plurality of layers of compound semiconductor material.

In accordance with another embodiment, the second dielectric liner is over the floor of the second trench, wherein the trench fill material comprises polysilicon that contacts the body of semiconductor material.

In accordance with another embodiment, an electrical interconnect connects one of the source electrode or the drain electrode to the trench fill material in the first trench.

FIG. 1 is a cross-sectional view of a portion of a semiconductor component 10 such as, for example, a Light Emitting Diode (LED), a power switching device, a regulator, a protection circuit, a driver circuit, etc. during manufacture in accordance with an embodiment of the present invention. What is shown in FIG. 1 is a semiconductor substrate 12 having opposing surfaces 14 and 16. Surface 14 may be referred to as a front or top surface and surface 16 may be referred to as a bottom or back surface. Semiconductor substrate 12 may be of p-type conductivity, n-type conductivity, or it may be an intrinsic semiconductor material. In accordance with an embodiment, semiconductor substrate 12 is silicon doped with an impurity material of p-type conductivity and has a resistivity ranging from about $1 \times 10^{-3}$ Ohm-centimeters ($\Omega$-cm) to about 100 $\Omega$-cm. Alternatively, substrate 12 can be silicon, silicon carbide, sapphire, a compound semiconductor material such as, gallium nitride, gallium arsenide, indium phosphide, or the like.

In accordance with an embodiment, substrate 12 is placed in a reaction chamber and a nucleation layer 18 having a thickness ranging from about a mono-layer of carbon to about 100 $\mu$m is formed on silicon substrate 12. Nucleation layer 18 can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like. By way of example, nucleation layer 18 is aluminum nitride. Other suitable materials for nucleation layer 18 include a combination of silicon and aluminum nitride, silicon carbide, aluminum gallium nitride, or the like.

An electric field stop layer 20 is formed on nucleation layer 18. Electric field stop layer 20 may be a highly doped gallium nitride (GaN) layer or aluminum gallium nitride (AlGaN) layer, a metal layer, a semi-metal layer, a material that is electrically conductive and able to make the electric field be zero, or the like. Electric field stop layer 20 may be of n-type conductivity or p-type conductivity and it may have a thickness ranging from about 1 nm to about 10 um.

A buffer layer 26 having a thickness ranging from about 0.1 $\mu$m to about 100 $\mu$m is formed on electric field stop layer 20 at a temperature ranging from about 150 degrees Celsius (° C.) to about 1,500° C. In accordance with an embodiment, buffer layer 26 is a layer of semiconductor material. A semiconductor material may be referred to as a material, a III-nitride material, a III-nitride semiconductor material, or the like. Suitable materials for buffer layer 26 include Group materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), or the like. Buffer layer 26 may be formed using MBE, PECVD, MOCVD, Metal Organic Vapor Phase Epitaxy (MOVPE), Remote Plasma Enhanced Chemical Vapor Deposition (RP-CVD), hydride vapor phase epitaxy (HVPE), liquid phase Epitaxy (LPE), Chloride Vapor Phase Epitaxy (Cl-VPE), or the like. It should be noted that buffer layer 26 may be comprised of a plurality of layers such as for example a plurality of AlN layers, a plurality of GaN layers, or alternating stacked MN and GaN layers. Buffer layer 26 may be of p-type conductivity, n-type conductivity, or it may be an intrinsic semiconductor material.

Still referring to FIG. 1, a channel layer 28 having a thickness ranging from about 0.01 $\mu$m to about 10 $\mu$m is formed on buffer layer 26 using one or more techniques selected from the group of techniques including MBE, PECVD, MOCVD, MOVPE, RP-CVD, HVPE, LPE, Cl-VPE, or the like. By way of example, channel layer 28 is a GaN layer having a thickness ranging from about 0.5 $\mu$m to about 100 $\mu$m.

A strained layer 30 having a thickness ranging from about 10 nanometers (nm) to about 1,000 nm is formed on channel layer 28 using one or more techniques selected from the group of techniques including MBE, PECVD, MOCVD, MOVPE, RP-CVD, HVPE, LPE, Cl-VPE, or the like. By way of example, strained layer 30 is an AlGaN layer having a thickness ranging from about 10 nm to about 100 nm. The combination of substrate 12 and nucleation layer 18 may be referred to as a semiconductor material 32.

A layer of photoresist is patterned over strained layer 30 to form a masking structure 34 having masking elements 36 and openings 38 that expose portions of strained layer 30.

Figure 2:
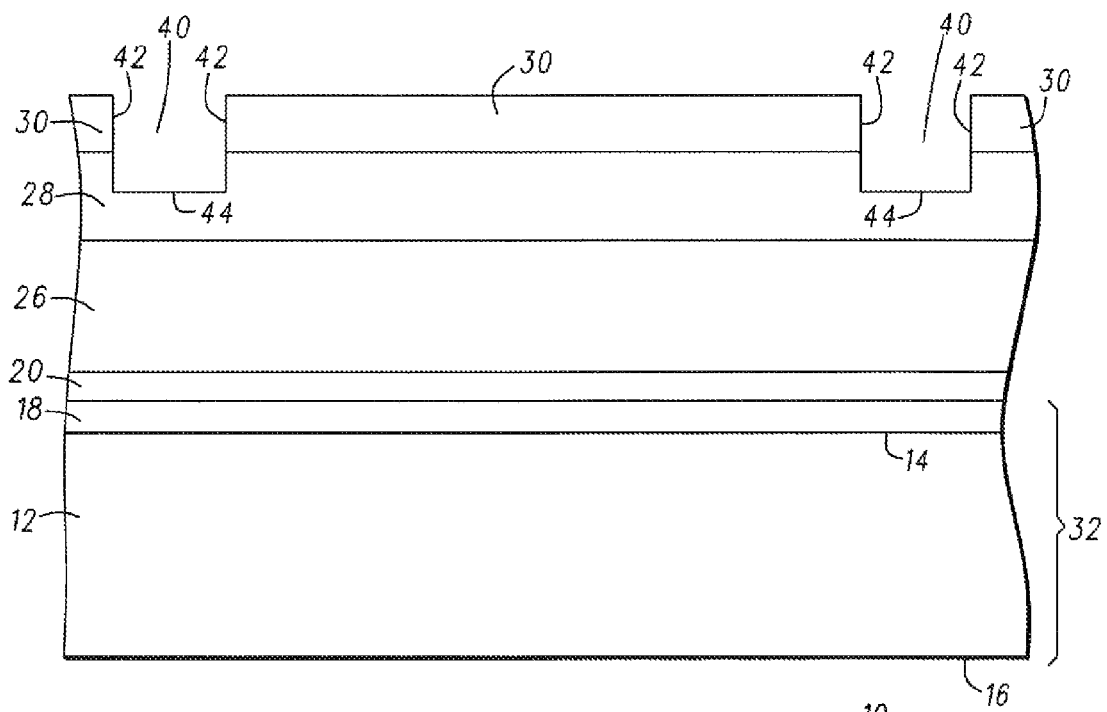
FIG. 2 is a cross-sectional view of the semiconductor component of FIG. 1 at a later stage of manufacture.

Referring now to FIG. 2, trenches 40 having sidewalls 42 and floors 44 are formed in the portions of semiconductor material exposed by openings 34 using, for example, a dry etching technique. In accordance with an embodiment, trenches 40 extend through strained layer 30 and into channel layer 28.

Figure 3:
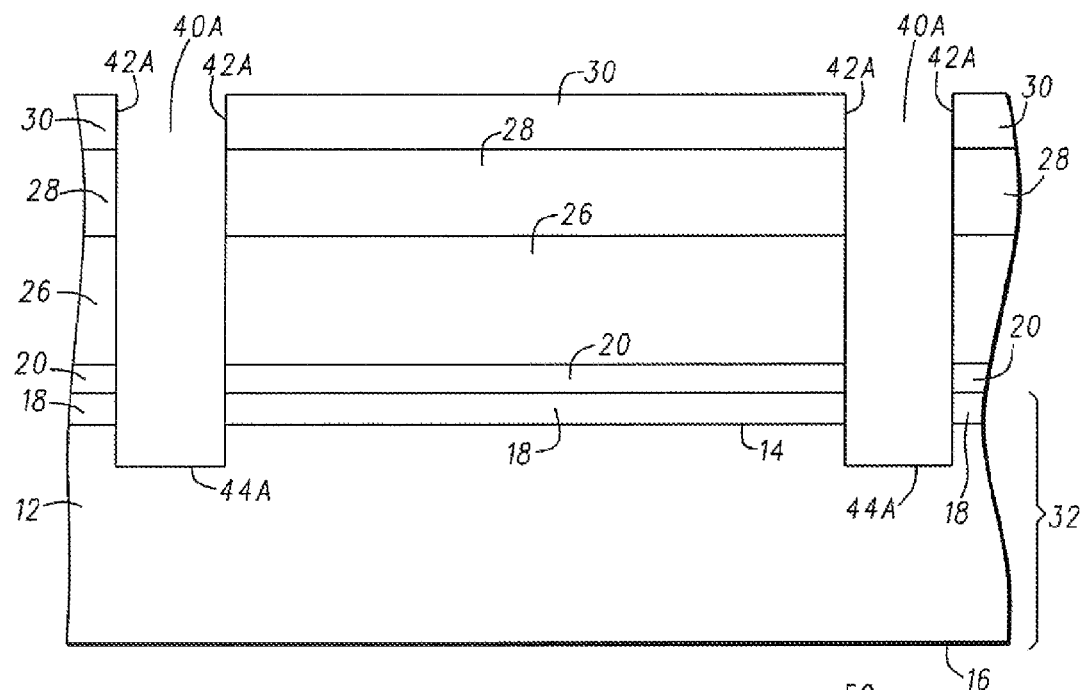
FIG. 3 is a cross-sectional view of the semiconductor component of FIG. 1 at a later stage of manufacture in accordance with another embodiment of the present invention.

FIG. 3 is a cross-sectional view of a semiconductor component 50 in accordance with another embodiment of the present invention. It should be noted that the description of FIG. 3 continues from the description of FIG. 1. Thus, to distinguish the embodiment of FIG. 3 from the embodiment of FIG. 2, the semiconductor component of FIG. 3 has been identified by reference character 50. In addition, reference character A has been added to reference characters 40, 42, and 44 of FIG. 3 to distinguish between the trenches of FIG. 2 and the trenches of FIG. 3. Trenches 40A having sidewalls 42A and floors 44A are formed in the portions of semiconductor material exposed by openings 34 using, for example, a dry etching technique. In accordance with an embodiment, trenches 40A extend through strained layer 30, channel layer 28, buffer layer 26, electric field stop layer 20, nucleation layer 18 and into semiconductor substrate 12.

Figure 4:
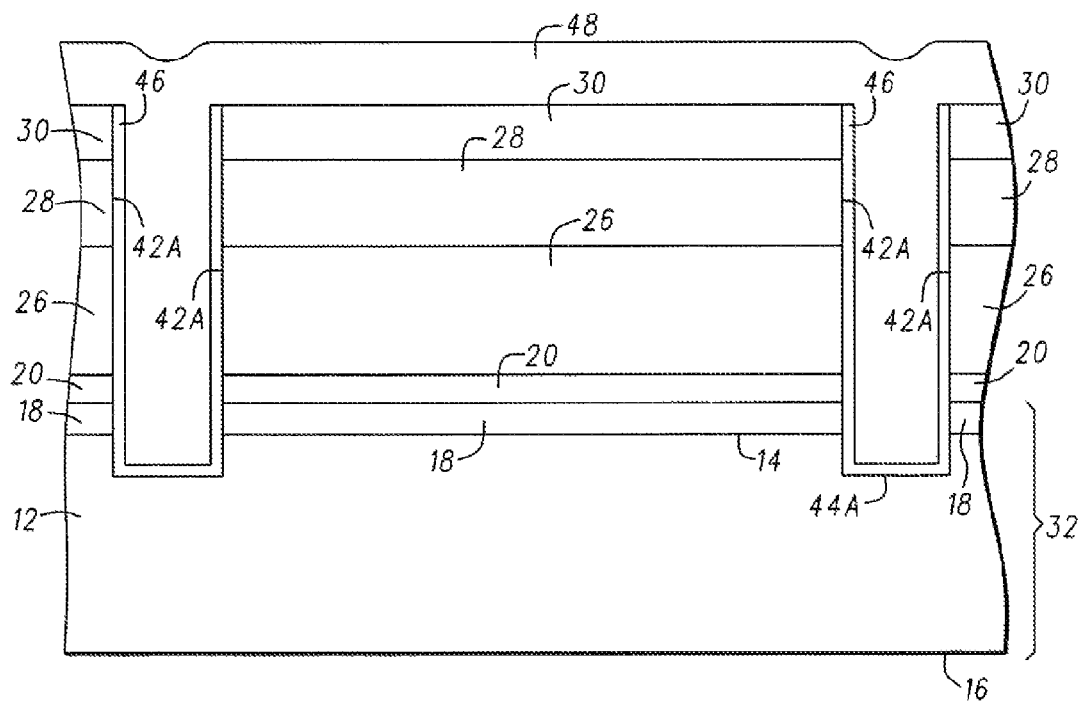
FIG. 4 is a cross-sectional view of the semiconductor component of FIG. 3 at a later stage of manufacture.

Referring now to FIG. 4, a layer 46 of electrically insulating material is formed on sidewalls 42A and floors 44A of each trench 40A. Electrically insulating layer 46 may be referred to as a dielectric layer or a dielectric liner. Electrically insulating layer 46 may be aluminum oxide, silicon nitride, or the like. A material 48 is formed on electrically insulating layers 46, wherein material 48 fills trenches 40A and is formed on strained layer 30. In accordance with an embodiment, material 48 is polysilicon doped with an impurity material of the same conductivity type as substrate 12. Alternatively material 48 may be a metal, an insulating material, intrinsic polysilicon, or the like.

Figure 5:
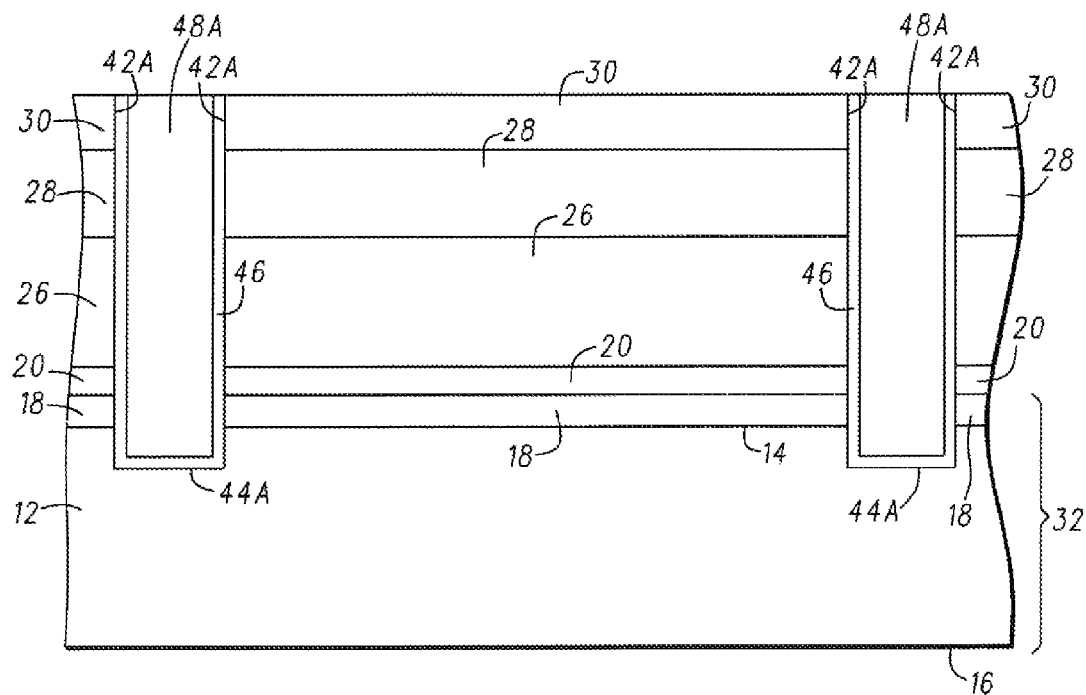
FIG. 5 is a cross-sectional view of the semiconductor component of FIG. 4 at a later stage of manufacture.

Referring now to FIG. 5, material 48 is planarized leaving portions 48A in trenches 40A.

Figure 6:
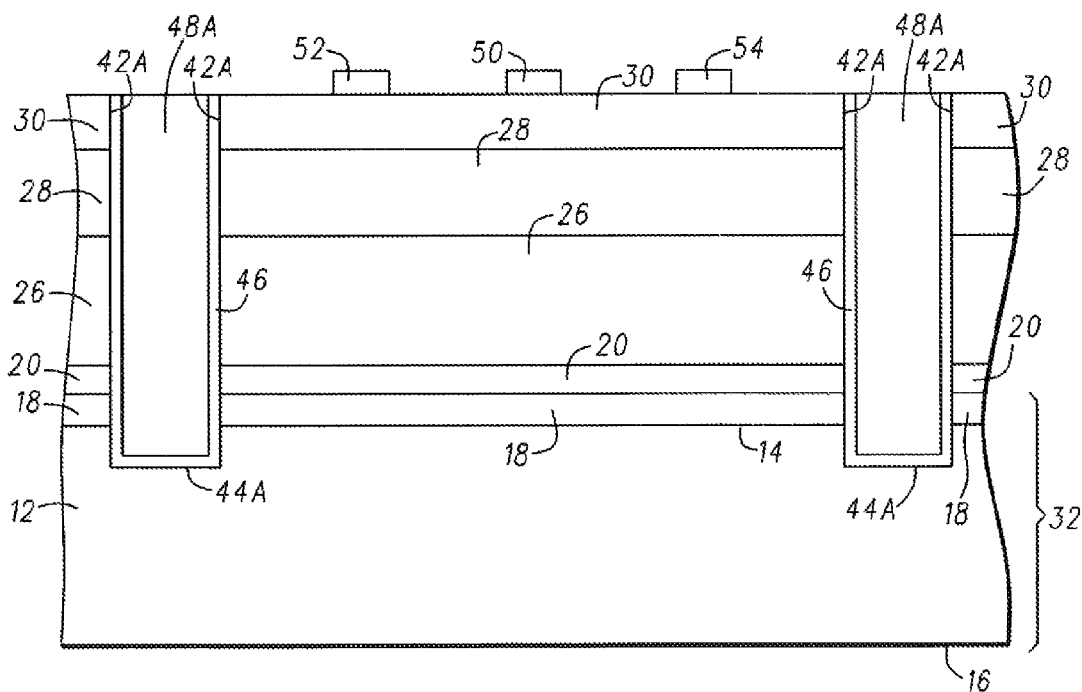
FIG. 6 is a cross-sectional view of the semiconductor component of FIG. 5 at a later stage of manufacture.

Referring now to FIG. 6, a gate electrode 50, a source electrode 52, and a drain electrode 54 are formed on portions of strained layer 30 that are between trenches 40A that are filled with portions 48A of material 48. Thus, a III-N based semiconductor component 50 is manufactured that includes trenches 40A that are lined with dielectric material 46 and filled with a material that may be an electrically conductive material or an electrically insulating material. The filled trenches inhibit leakage paths along the GaN/AlGaN interfaces in the bulk material from occurring, which gives better high voltage isolation. In addition, electric field layer 20 extends from a filled trench 40A to an adjacent filled trench 40A, which further improves high voltage isolation.

Figure 7:
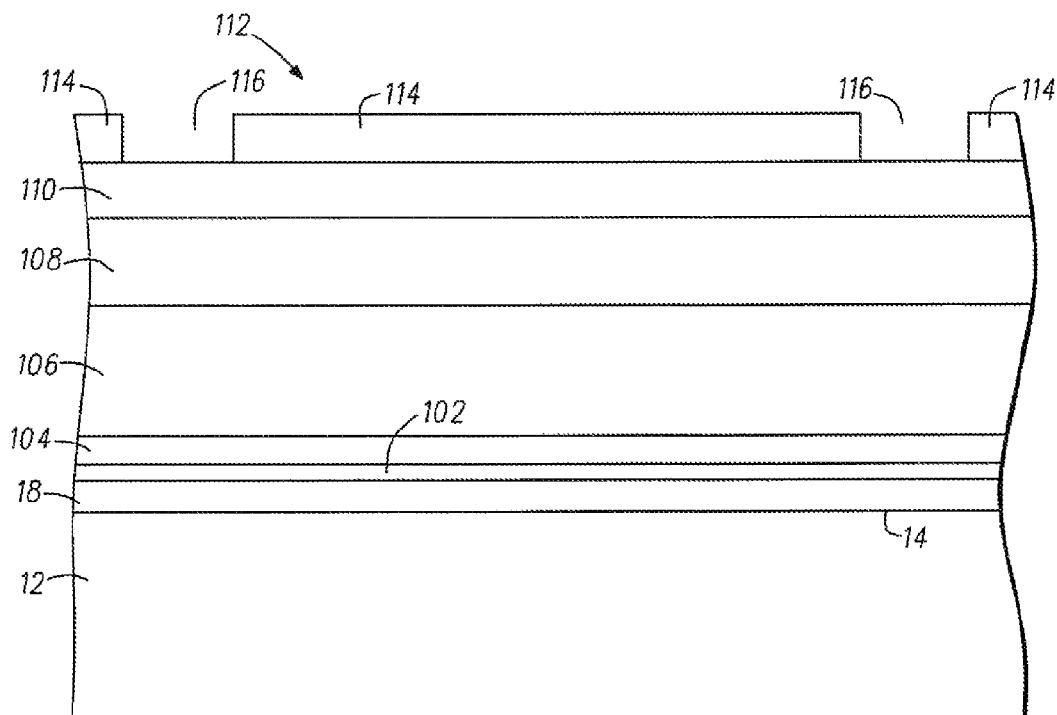
FIG. 7 is a cross-sectional view of a semiconductor component in accordance with another embodiment of the present invention.

Referring now to FIG. 7, a cross-sectional view of a semiconductor component 100 in accordance with another embodiment of the invention is shown. What is shown in FIG. 7 is a semiconductor substrate 12 having opposing surfaces 14 and 16. Surface 14 may be referred to as a front or top surface and surface 16 may be referred to as a bottom or back surface. Semiconductor substrate 12 may be of p-type conductivity, n-type conductivity, or it may be an intrinsic semiconductor material. In accordance with an embodiment, semiconductor substrate 12 is silicon doped with an impurity material of p-type conductivity and has a resistivity of at least about 5 Ohm-centimeters (Ω-cm). Alternatively, substrate 12 can be silicon, silicon carbide, sapphire, a compound semiconductor material such as, gallium nitride, gallium arsenide, indium phosphide, or the like.

In accordance with an embodiment, substrate 12 is placed in a reaction chamber and a nucleation layer 18 having a thickness ranging from about a mono-layer of carbon to about 100 μm is formed on silicon substrate 12. Nucleation layer 18 can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like. By way of example, nucleation layer 18 is aluminum nitride. Other suitable materials for nucleation layer 18 include silicon and aluminum nitride, silicon carbide, aluminum gallium nitride, or the like.

A portion 102 of a buffer layer is formed on nucleation layer 18. Portion 102 may be GaN, graded AlGaN, GaN/AlGaN, a GaN/AlN (gallium-nitride/aluminum-nitride) superlattice, or the like.

An electric field stop layer 104 is formed on layer 102. Electric field stop layer 104 may be a highly doped gallium nitride (GaN) layer or aluminum gallium nitride (AlGaN) layer, a metal layer, a semi-metal layer, a material that is electrically conductive and able to make the electric field be zero or substantially zero. Electric field stop layer 104 may be of n-type conductivity or p-type conductivity and it may have a thickness ranging from about 1 nm to about 10 um.

A buffer layer 106 having a thickness ranging from about 0.1 μm to about 100 μm is formed on electric field stop layer 104 at a temperature ranging from about 150° C. to about 1,500° C. In accordance with an embodiment, buffer layer 106 is a layer of material. Suitable materials for buffer layer 106 include Group materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), or the like. Buffer layer 106 may be formed using MBE, PECVD, MOCVD, Metal Organic Vapor Phase Epitaxy (MOVPE), Remote Plasma Enhanced Chemical Vapor Deposition (RP-CVD), hydride vapor phase epitaxy (HVPE), liquid phase Epitaxy (LPE), Chloride Vapor Phase Epitaxy (Cl-VPE), or the like. It should be noted that buffer layer 26 may be comprised of a plurality of layers such as for example a plurality of AlN layers, a plurality of GaN layers, or alternating stacked AlN and GaN layers. Buffer layer 106 may be of p-type conductivity, n-type conductivity, or it may be an intrinsic semiconductor material.

Still referring to FIG. 7, a channel layer 108 having a thickness ranging from about 0.1 μm to about 10 μm is formed on buffer layer 106 using one or more techniques selected from the group of techniques including MBE, PECVD, MOCVD, MOVPE, RP-CVD, HVPE, LPE, Cl-VPE, or the like. By way of example, channel layer 108 is a GaN layer having a thickness ranging from about 0.5 μm to about 7.5 μm.

A strained layer 110 having a thickness ranging from about 10 nanometers (nm) to about 1,000 nm is formed on channel layer 108 using one or more techniques selected from the group of techniques including MBE, PECVD, MOCVD, MOVPE, RP-CVD, HVPE, LPE, Cl-VPE, or the like. By way of example, strained layer 110 is an AlGaN layer having a thickness ranging from about 10 nm to about 100 nm.

A layer of photoresist is patterned over strained layer 110 to form a masking structure 112 having masking elements 114 and openings 116 that expose portions of strained layer 110.

Figure 8:
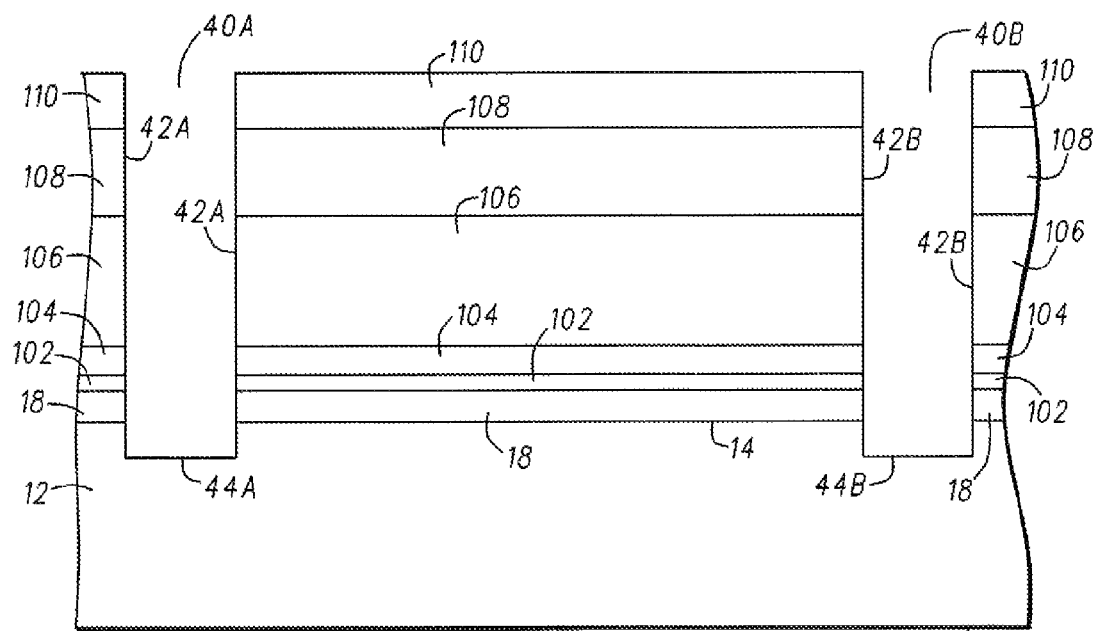
FIG. 8 is a cross-sectional view of the semiconductor component of FIG. 7 at a later stage of manufacture.

Referring now to FIG. 8, a trench 40A having sidewalls 42A and a floor 44A and a trench 40B having sidewalls 42B and a floor 44B are formed in the portions of semiconductor material exposed by openings 116 using, for example, a dry etching technique. In accordance with an embodiment, trenches 40A and 40B extend through strained layer 110, channel layer 108, buffer layer 26, electric field stop layer 104, nucleation layer 18 and into semiconductor substrate 12.

Figure 9:
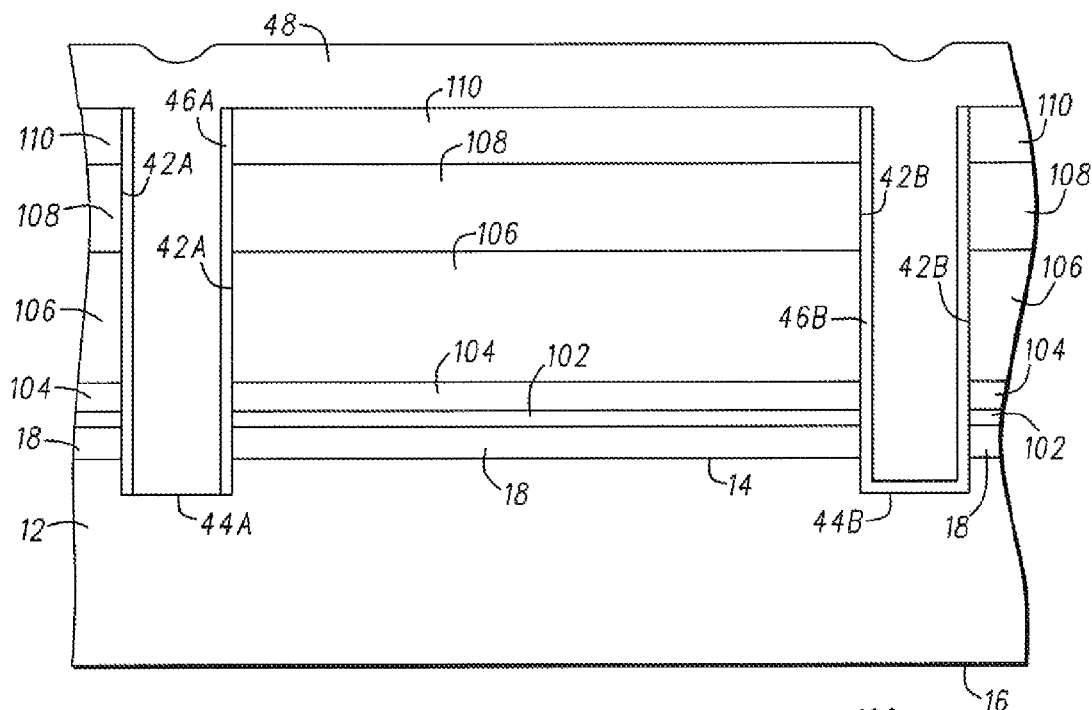
FIG. 9 is a cross-sectional view of the semiconductor component of FIG. 8 at a later stage of manufacture.

Referring now to FIG. 9, layers 46A of electrically insulating material are formed on sidewalls 42A of trench 40A and a layer 46B of electrically insulating material is formed on sidewalls 42B and floor 44B of trench 40B. Layers 46A and 46B may be referred to as dielectric layers or dielectric liners. Layers 46A and 46B may be aluminum oxide, silicon nitride, or the like. A material 48 is formed on insulating layers 46A and 46B and on strained layer 110, wherein material 48 fills trenches 40A and 40B. In accordance with an embodiment, material 48 is polysilicon doped with an impurity material of the same conductivity type as substrate 12. Alternatively material 48 may be a metal, an insulating material, intrinsic polysilicon, or the like.

Figure 10:
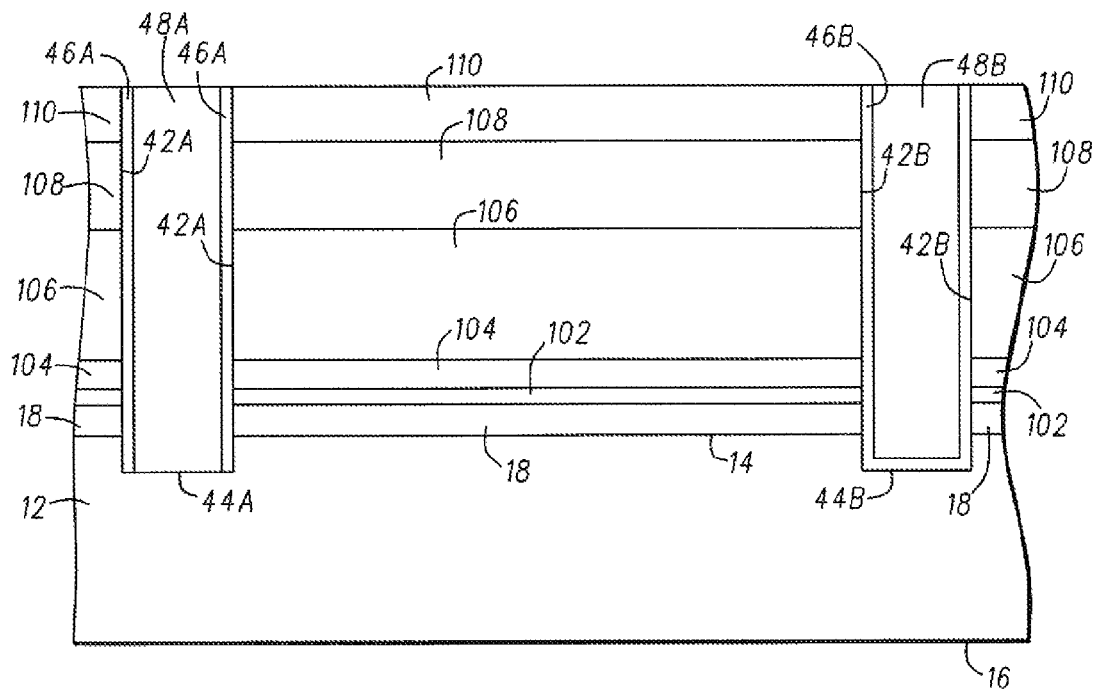
FIG. 10 is a cross-sectional view of the semiconductor component of FIG. 9 at a later stage of manufacture.

Referring now to FIG. 10, material 48 is planarized leaving portions 48A and 48B in trenches 40A and 40B, respectively.

Figure 11:
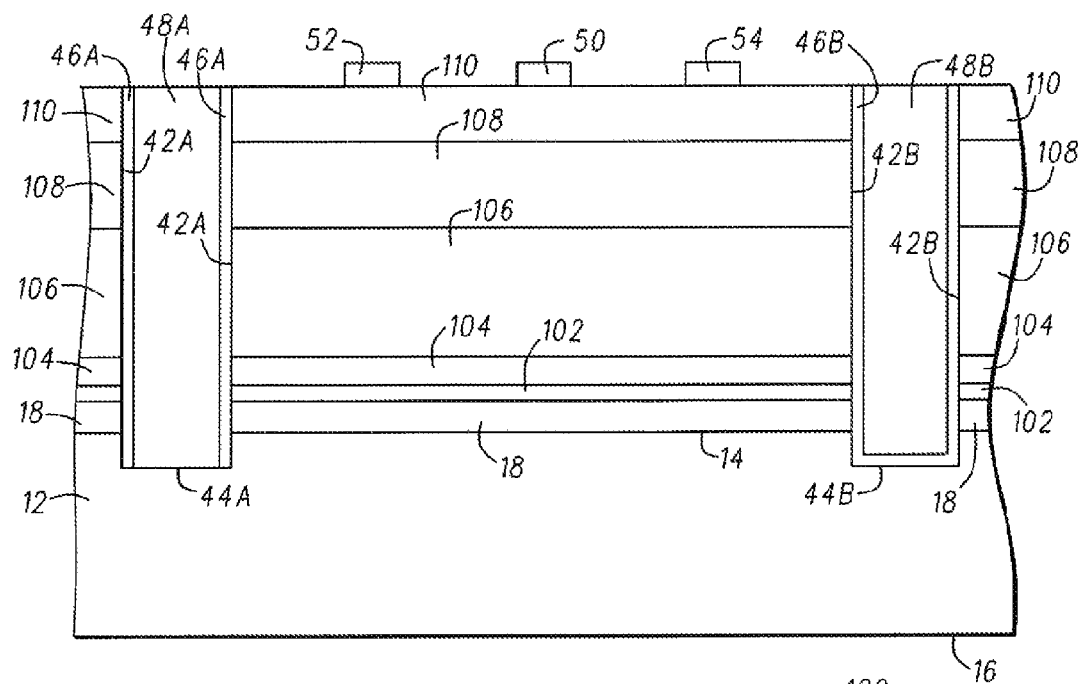
FIG. 11 is a cross-sectional view of the semiconductor component of FIG. 10 at a later stage of manufacture.

Referring now to FIG. 11, a gate electrode 50, a source electrode 52, and a drain electrode 54 are formed on portions of strained layer 110 that are between trenches 40A and 40B that are filled with portions 48A and 48B, respectively, of material 48. Thus, a III-N based semiconductor component 100 is manufactured that includes trenches 40A and 40B that are lined with dielectric material 46A and 46B, respectively, and filled with a material that may be an electrically conductive material or an electrically insulating material. The filled trenches inhibits leakage paths along the GaN/AlGaN interfaces in the bulk material from occurring, which gives better high voltage isolation. In addition, electric field layer 20 extends from a filled trench 40A to filled trench 40B, which further improves high voltage isolation. Trench fill material 48A of filled trench 40A is in electrical contact with substrate 12 and thus trench fill material 48A and substrate 12 can be set at the same electric potential, e.g., a ground potential.

Figure 12:
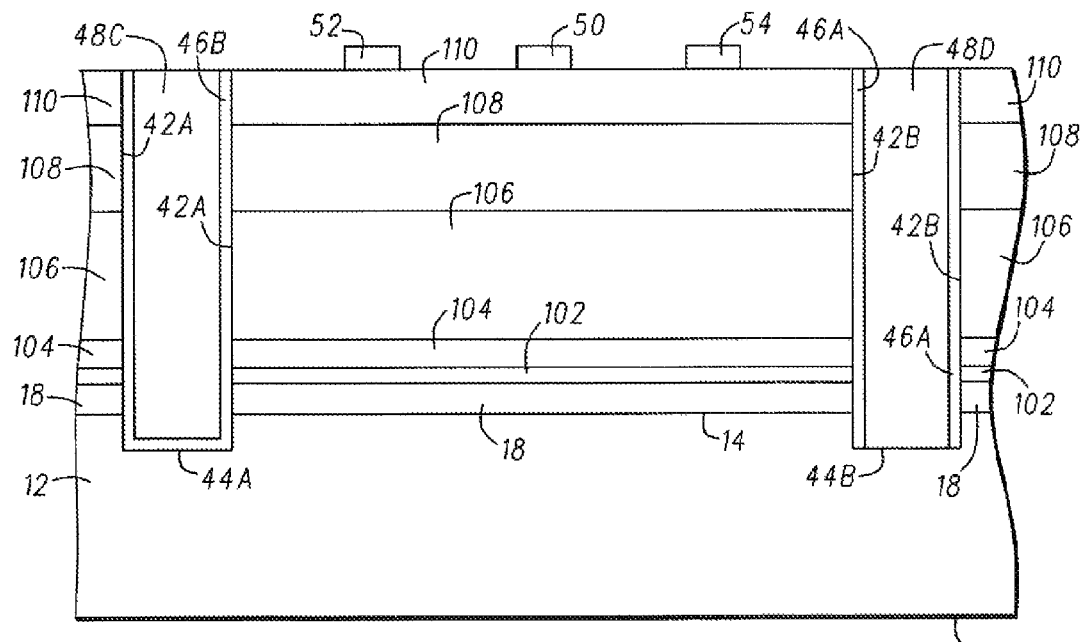
FIG. 12 is a cross-sectional view of a semiconductor component during manufacture in accordance with another embodiment of the present invention.

FIG. 12 is a cross-sectional view of a semiconductor component 120 during manufacture in accordance with another embodiment of the present invention. Semiconductor component 120 is similar to semiconductor component 100 except that an insulating material 46B is formed on sidewalls 42A and floor 44A of trench 40A and insulating material 46A is formed on sidewalls 42B but is absent from floor 44B. Reference characters A and B have been appended to reference character 46 to distinguish between the dielectric material in trenches 40A and 40B. In addition, material 48C is formed on insulating layer 46B and material 48D is formed on insulating layers 46A and floor 44B. Reference characters C and D have been appended to reference character 48 to indicate that the portion of material 48, i.e., portion 48D, in trench 40B is in contact with substrate 12 whereas the portion of material 48, i.e., portion 48C, that is in trench 40A is electrically insulated from substrate 12 at floor 44A. Thus, a III-N based semiconductor component 120 is manufactured that includes trenches 40A and 40B that are lined with dielectric material 46B and 46A, respectively, and filled with a material that may be an electrically conductive material or an electrically insulating material. The filled trenches inhibit leakage paths along the GaN/AlGaN interfaces in the bulk material from occurring, which gives better high voltage isolation. In addition, electric field layer 20 extends from a filled trench 40A to filled trench 40B, which further improves high voltage isolation. Trench fill material 48D of filled trench 40B is in electrical contact with substrate 12 and thus trench fill material 48B and substrate 12 can be set at the same electric potential, e.g., a ground potential.

Figure 13:
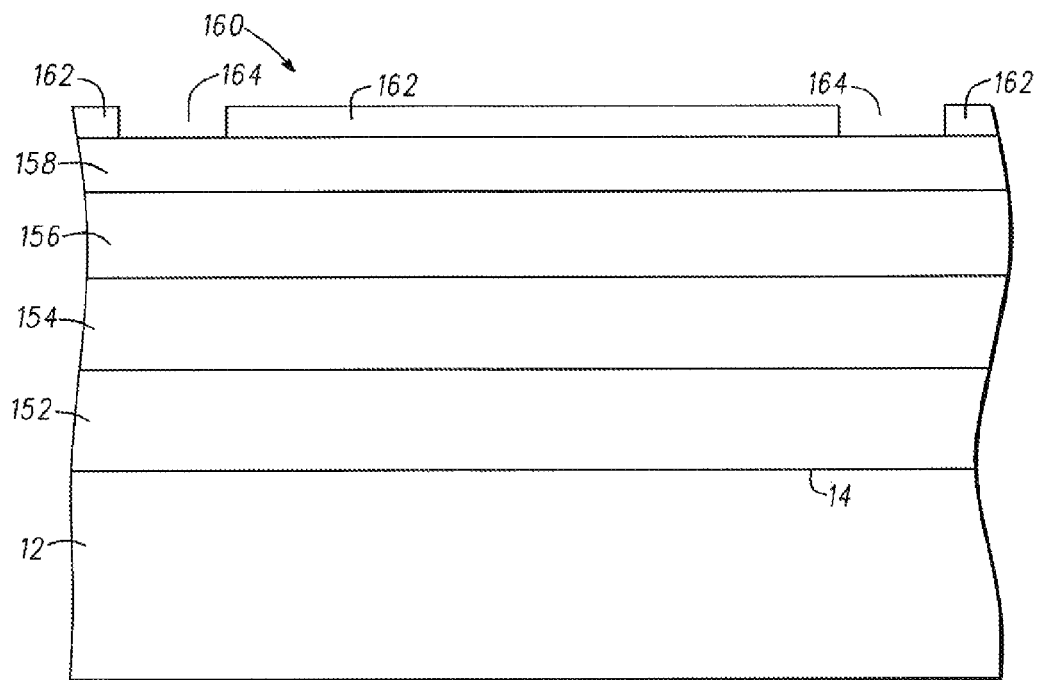
FIG. 13 is a cross-sectional view of a semiconductor component during manufacture in accordance with another embodiment of the present invention.

FIG. 13 is a cross-sectional view of a portion of a semiconductor component 150 such as, for example, a Light Emitting Diode (LED), a power switching device, a regulator, a protection circuit, a driver circuit, etc. during manufacture in accordance with an embodiment of the present invention. What is shown in FIG. 13 is a semiconductor substrate 12 having opposing surfaces 14 and 16. Surface 14 may be referred to as a front or top surface and surface 16 may be referred to as a bottom or back surface. Semiconductor substrate 12 may be of p-type conductivity, n-type conductivity, or it may be an intrinsic semiconductor material. In accordance with an embodiment, semiconductor substrate 12 is silicon doped with an impurity material of p-type conductivity and has a resistivity of at least about 5 Ohm-centimeters (Ω-cm). Alternatively, substrate 12 can be silicon, silicon carbide, sapphire, a compound semiconductor material such as, gallium nitride, gallium arsenide, indium phosphide, or the like.

In accordance with an embodiment, substrate 12 is placed in a reaction chamber and an electric field stop layer 152 is formed on substrate 12. Electric field stop layer 152 may be a highly doped gallium nitride (GaN) layer or aluminum gallium nitride (AlGaN) layer, a metal layer, a semi-metal layer, a material that is electrically conductive and able to make the electric field be zero or substantially zero. Electric field stop layer 104 may be of n-type conductivity or p-type conductivity and may have a thickness ranging from about 1 nm to about 10 um. It should be noted that electric field stop layer 152 can be inside the buffer layer, or it can extend from the buffer layer into the nucleation layer, or it can extend from buffer layer all the way into substrate 12.

Electric field stop layer 152 can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like.

A buffer layer 154 having a thickness ranging from about 0.1 μm to about 100 μm is formed on electric field stop layer 152 at a temperature ranging from about 150° C. to about 1,500° C. In accordance with an embodiment, buffer layer 154 is a layer of III-N material. Suitable materials for buffer layer 154 include Group III-N materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), or the like. Buffer layer 154 may be formed using MBE, PECVD, MOCVD, Metal Organic Vapor Phase Epitaxy (MOVPE), Remote Plasma Enhanced Chemical Vapor Deposition (RP-CVD), hydride vapor phase epitaxy (HVPE), liquid phase Epitaxy (LPE), Chloride Vapor Phase Epitaxy (Cl-VPE), or the like. It should be noted that buffer layer 154 may be comprised of a plurality of layers such as for example a plurality of AlN layers, a plurality of GaN layers, or alternating stacked MN and GaN layers. Buffer layer 154 may be of p-type conductivity, n-type conductivity, or it may be an intrinsic semiconductor material.

Still referring to FIG. 13, a channel layer 156 having a thickness ranging from about 0.1 μm to about 10 μm is formed on buffer layer 154 using one or more techniques selected from the group of techniques including MBE, PECVD, MOCVD, MOVPE, RP-CVD, HVPE, LPE, Cl-VPE, or the like. By way of example, channel layer 156 is a GaN layer having a thickness ranging from about 0.5 μm to about 7.5 μm.

A strained layer 158 having a thickness ranging from about 10 nanometers (nm) to about 1,000 nm is formed on channel layer 156 using one or more techniques selected from the group of techniques including MBE, PECVD, MOCVD, MOVPE, RP-CVD, HVPE, LPE, Cl-VPE, or the like. By way of example, strained layer 158 is an AlGaN layer having a thickness ranging from about 10 nm to about 100 nm.

A layer of photoresist is patterned over strained layer 158 to form a masking structure 160 having masking elements 162 and openings 164 that expose portions of strained layer 158.

Figure 14:
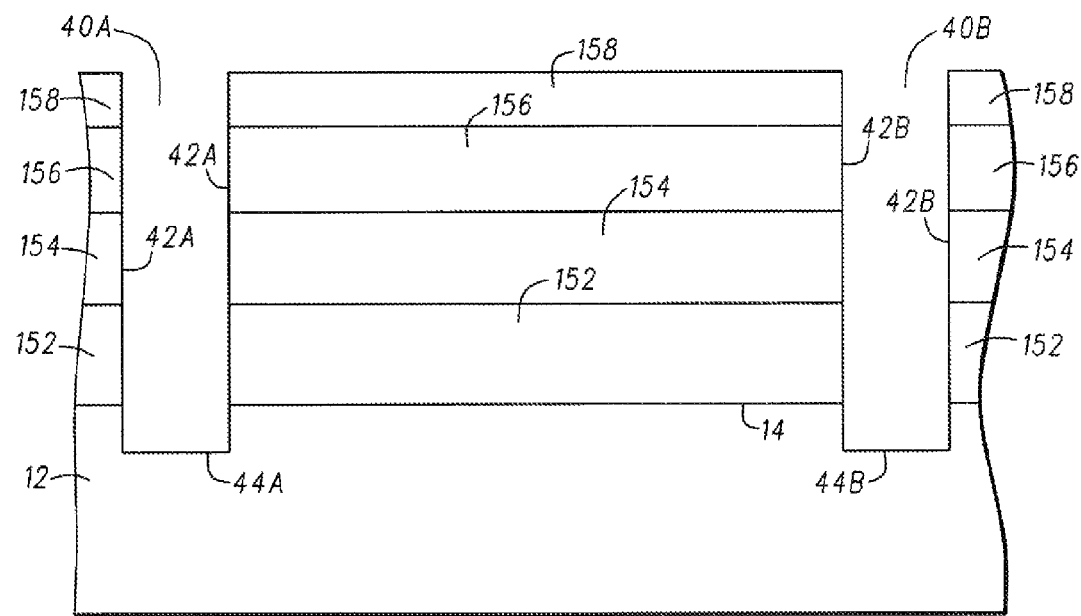
FIG. 14 is a cross-sectional view of the semiconductor component of FIG. 13 at a later stage of manufacture.

Referring now to FIG. 14, a trench 40A having sidewalls 42A and a floor 44A and a trench 40B having sidewalls 42B and a floor 44B are formed in the portions of semiconductor material exposed by openings 164 using, for example, a dry etching technique. In accordance with an embodiment, trenches 40A and 40B extend through strained layer 158, channel layer 156, buffer layer 154, electric field stop layer 152, and into semiconductor substrate 12.

Figure 15:
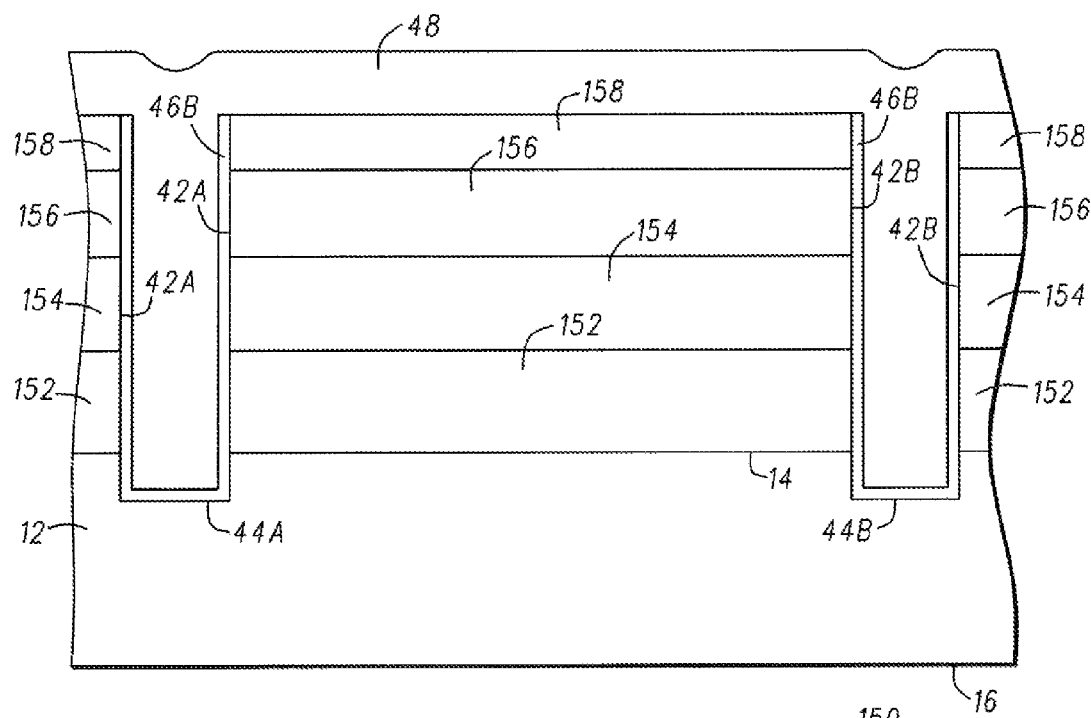
FIG. 15 is a cross-sectional view of the semiconductor component of FIG. 14 at a later stage of manufacture.

Referring now to FIG. 15, a layer 46B of electrically insulating material is formed on sidewalls 42A and floors 44A of trench 40A and a layer of dielectric material 46B is formed on sidewalls 42B and floor 44B of trench 40B. Layers 46B may be referred to as dielectric layers or dielectric liners. Layers 46B may be aluminum oxide, silicon nitride, or the like. It should be noted that a dielectric layer may be conformally deposited on strained layer 158 and along sidewalls 42A and 42B of trenches 40A and 40B, respectively. The dielectric layer is removed to expose strained layer 158 but leave layers 46A and 46B on sidewalls 42A and 42B of trenches 40A and 40B, respectively. A material 48 is formed on insulating layers 46B wherein material 48 fills trenches 40A and 40B and is formed on strained layer 158. In accordance with an embodiment, material 48 is polysilicon doped with an impurity material of the same conductivity type as substrate 12. Alternatively material 48 may be a metal, an insulating material, intrinsic polysilicon, or the like.

Figure 16:
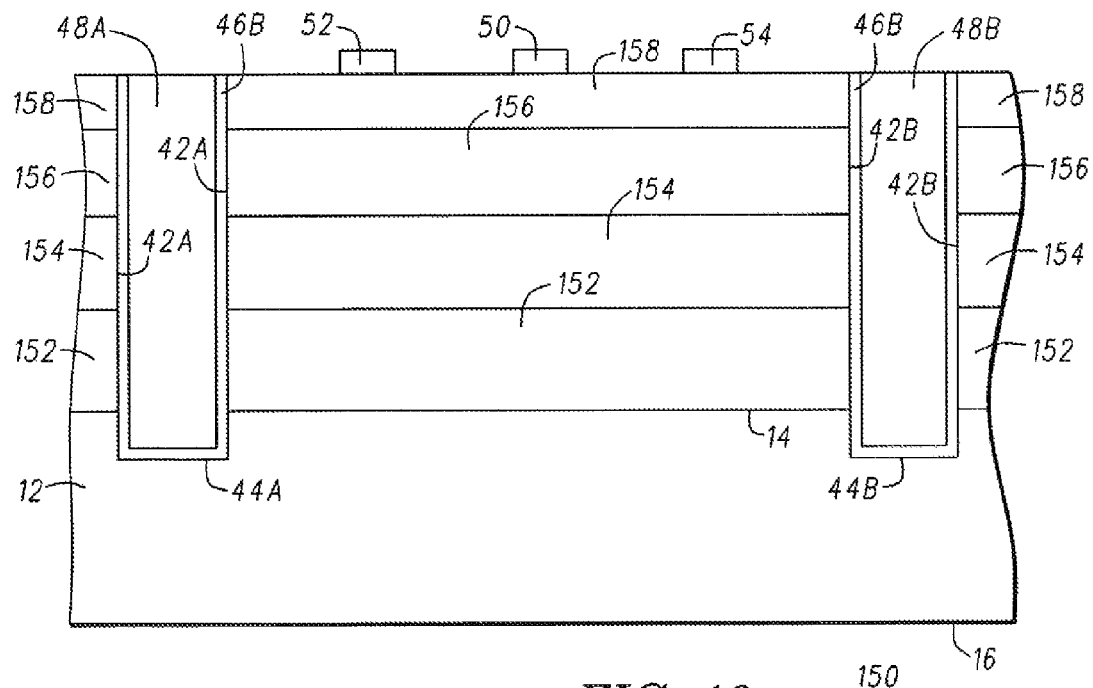
FIG. 16 is a cross-sectional view of the semiconductor component of FIG. 15 at a later stage of manufacture.

Referring now to FIG. 16, material 48 is planarized leaving portions 48A and 48B in trenches 40A and 40B, respectively. A gate electrode 50, a source electrode 52, and a drain electrode 54 are formed on portions of strained layer 158 that are between trenches 40A and 40B that are filled with portions 48A and 48B, respectively, of material 48. Thus, a III-N semiconductor device 150 having a gate electrode 50, a source electrode 52, and a drain electrode 54 is formed. By way of example, semiconductor device 150 is a HEMT semiconductor device. III-N based semiconductor component 150 is manufactured that includes trenches 40A and 40B that are lined with dielectric material 46B, and filled with a material that may be an electrically conductive material or an electrically insulating material. The filled trenches inhibit leakage paths along the GaN/AlGaN interfaces in the bulk material from occurring, which gives better high voltage isolation. In addition, electric field stop layer 152 extends from a filled trench 40A to filled trench 40B, which further improves high voltage isolation. Electric field stop layer 152 also extends from buffer layer 154 to substrate 12, which provides additional isolation.

Figure 17:
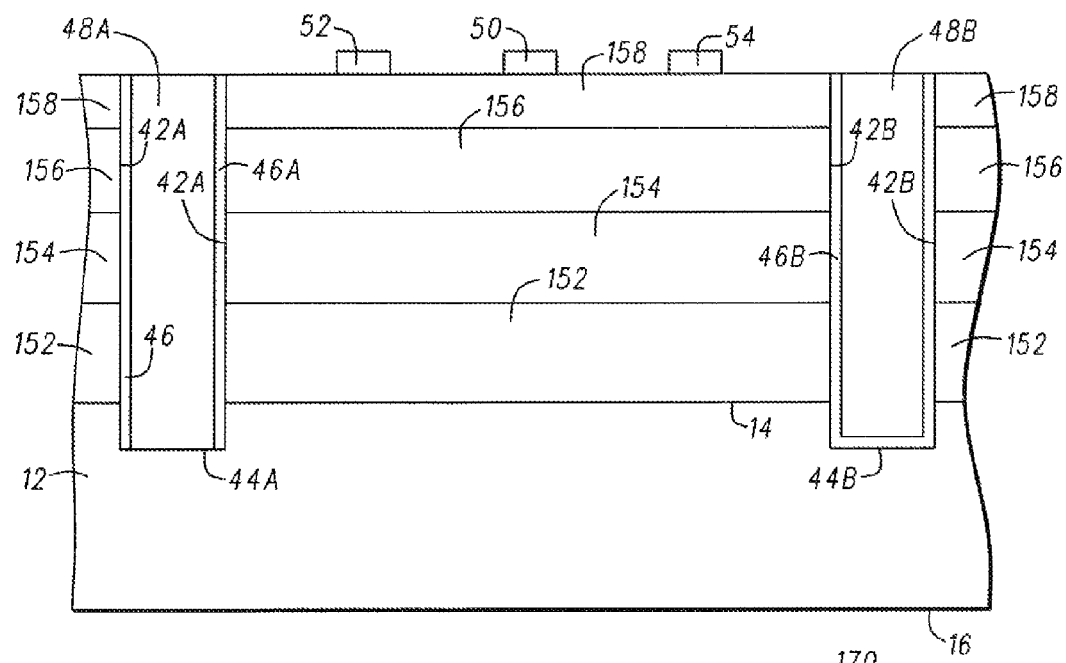
FIG. 17 is a cross-sectional view of a semiconductor component during manufacture in accordance with another embodiment of the present invention.

FIG. 17 is a cross-sectional view of a semiconductor component 170 during manufacture in accordance with another embodiment of the present invention. Semiconductor component 170 is similar to semiconductor component 150 except that an insulating material 46B is formed on sidewalls 42A and floor 44A but insulating material 46A is absent from floor 44B similar to semiconductor component 100 described with reference to FIGS. 9-11. Formation of portions 48A and 48B of material 48 have been described with reference to FIGS. 9 and 10. Thus, a III-N based semiconductor component 170 is manufactured that includes trenches 40A and 40B that are lined with dielectric material 46A and 46B, respectively, and filled with a material that may be an electrically conductive material or an electrically insulating material. The filled trenches inhibit leakage paths along the GaN/AlGaN interfaces in the bulk material from occurring, which gives better high voltage isolation. In addition, electric field layer 20 extends from filled trench 40A to filled trench 40B, which further improves high voltage isolation. Trench fill material 48A of filled trench 40A is in electrical contact with substrate 12 and thus trench fill material 48A and substrate 12 can be set at the same electric potential, e.g., a ground potential. What's more, electric field stop layer 152 extends from buffer layer 154 to substrate 12, providing additional electrical isolation.

Figure 18:
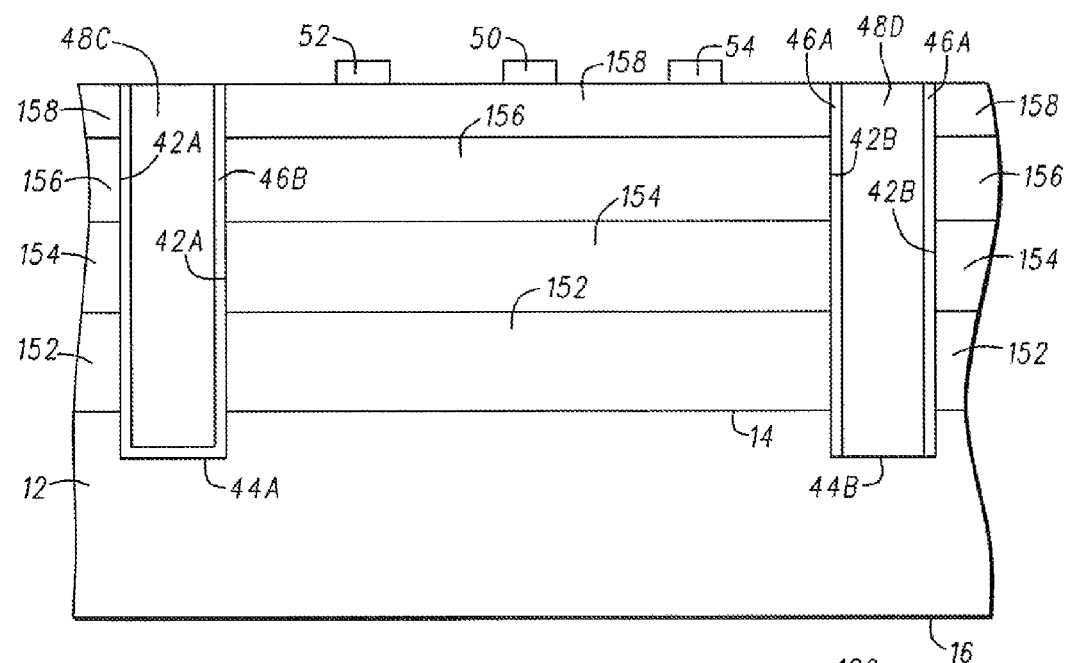
FIG. 18 is a cross-sectional view of a semiconductor component during manufacture in accordance with another embodiment of the present invention.

FIG. 18 is a cross-sectional view of a semiconductor component 180 during manufacture in accordance with another embodiment of the present invention. Semiconductor component 180 is similar to semiconductor component 150 except that an insulating material 46B is formed on sidewalls 42A and floor 44A but insulating material 46A is formed on sidewalls 42B but is absent from floor 44B similar to semiconductor component 120 described with reference to FIG. 12. Portions 48C and 48D of material 48 are formed in trenches 40A and 40B, respectively, which formation has been described with reference to FIG. 12. Thus, III-N based semiconductor component 180 includes trenches 40A and 40B lined with dielectric material 46A and 46B, respectively, and filled with a material that may be an electrically conductive material or an electrically insulating material. The filled trenches inhibit leakage paths along the GaN/AlGaN interfaces in the bulk material from occurring, which gives better high voltage isolation. In addition, electric field stop layer 152 extends from filled trench 40A to filled trench 40B, which further improves high voltage isolation. Trench fill material 48D of filled trench 40B is in electrical contact with substrate 12 and thus trench fill material 48D and substrate 12 can be set at the same electric potential, e.g., a ground potential. Further, electric field stop layer 152 extends from buffer layer 154 to substrate 12, providing additional electrical isolation.

Figure 19:
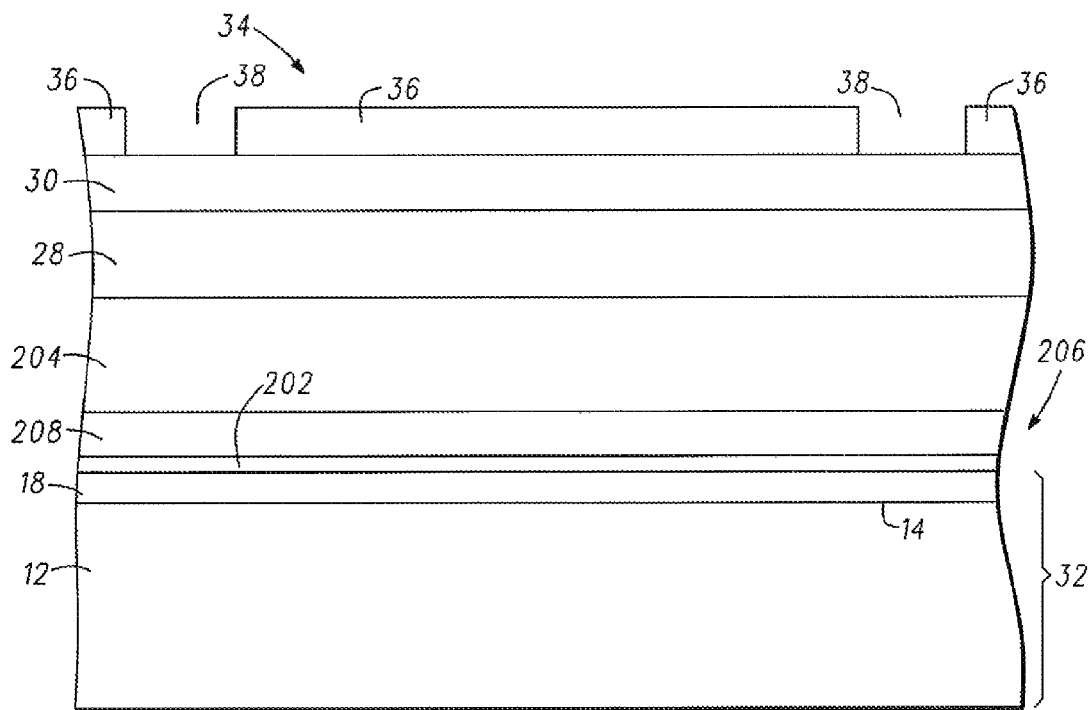
FIG. 19 is a cross-sectional view of a semiconductor component during manufacture in accordance with another embodiment of the present invention.

FIG. 19 is a cross-sectional view of a semiconductor component 200 during manufacture in accordance with another embodiment of the present invention. What is shown in FIG. 19 is a semiconductor substrate 12 having opposing surfaces 14 and 16. A nucleation layer 18 is formed on semiconductor substrate 12. Semiconductor substrate 12, nucleation layer 18, and methods of their formation have been described with reference to FIG. 1.

A portion 202 of a buffer layer 206 having a thickness ranging from about 1 nm to about 5 μm is formed on nucleation layer 18 using a technique such as, MBE, PECVD, MOCVD, Metal Organic Vapor Phase Epitaxy (MOVPE), Remote Plasma Enhanced Chemical Vapor Deposition (RP-CVD), hydride vapor phase epitaxy (HVPE), liquid phase Epitaxy (LPE), Chloride Vapor Phase Epitaxy (Cl-VPE), or the like. The reactant composition of the reaction chamber is designed for growing about 100 nm of buffer layer 206, i.e., the portion identified by reference character 202. After forming portion 202, the reactant composition of the chamber is changed or adjusted to grow an electric field stop layer 208 having a thickness ranging from about 1 μm to about 5 μm on portion 202 of buffer layer 206. Electric field stop layer 208 may be formed by changing the reactants to include magnesium, carbon, iron, or the like. Then, the reactant composition in the reactor chamber is changed to continue growing buffer layer 206, wherein a portion 204 of buffer layer 206 is formed on electric field stop layer 208. Thus, buffer layer 206 is comprised of a portion 202 and a portion 204, with a portion of electric field stop layer 208 between buffer layer portions 202 and 204.

Buffer layer 206 may be formed at a temperature ranging from about 150° C. to about 1,500° C. In accordance with an embodiment, portions 202 and 204 of buffer layer 206 are layers of III-N material. Suitable materials for buffer layer 206 include Group III-N materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), or the like. It should be noted that buffer layer 206 may be comprised of a plurality of layers such as for example a plurality of AlN layers, a plurality of GaN layers, or alternating stacked AlN and GaN layers. Buffer layer 206 may be of p-type conductivity, n-type conductivity, or it may be an intrinsic semiconductor material.

Still referring to FIG. 19, a channel layer 28 having a thickness ranging from about 0.1 µm to about 10 µm is formed on portion 204 of buffer layer 206 using one or more techniques selected from the group of techniques including MBE, PECVD, MOCVD, MOVPE, RP-CVD, HVPE, LPE, Cl-VPE, or the like. By way of example, channel layer 28 is a GaN layer having a thickness ranging from about 0.5 µm to about 7.5 µm.

A strained layer 30 having a thickness ranging from about 10 nanometers (nm) to about 1,000 nm is formed on channel layer 28 using one or more techniques selected from the group of techniques including MBE, PECVD, MOCVD, MOVPE, RP-CVD, HVPE, LPE, Cl-VPE, or the like. By way of example, strained layer 30 is an AlGaN layer having a thickness ranging from about 10 nm to about 100 nm. Substrate 12 and nucleation layer 18 may be referred to as a semiconductor material 32.

A layer of photoresist is patterned over strained layer 30 to form a masking structure 34 having masking elements 36 and openings 38 that expose portions of strained layer 30.

Figure 20:
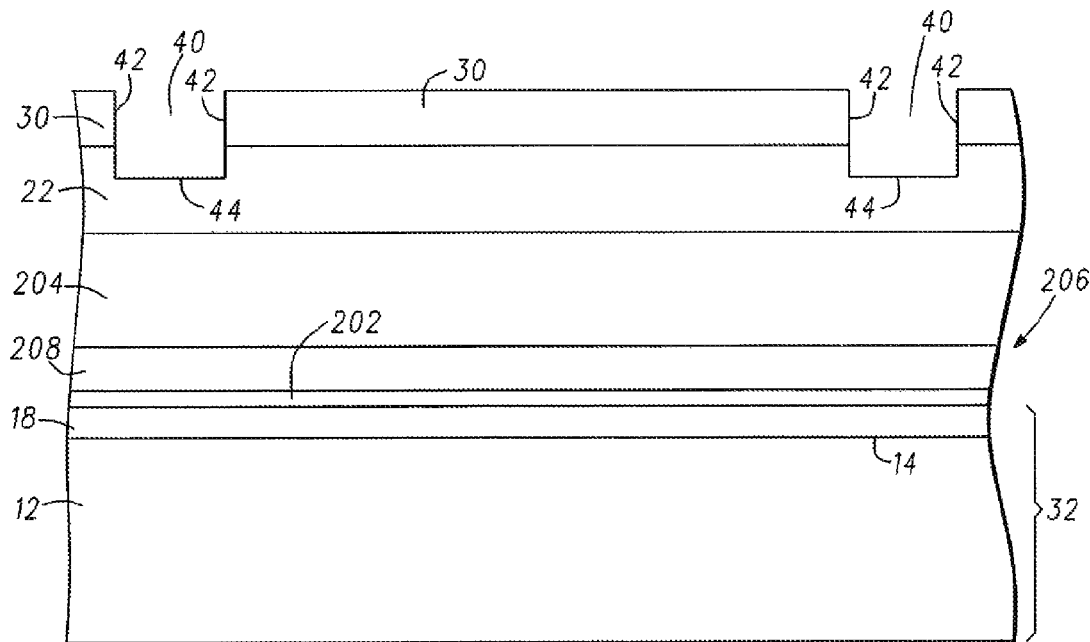
FIG. 20 is a cross-sectional view of the semiconductor component of FIG. 19 at a later stage of manufacture.

Referring now to FIG. 20, trenches 40 having sidewalls 42 and floors 44 are formed in the portions of semiconductor material exposed by openings 34 using, for example, a dry etching technique. In accordance with an embodiment, trenches 40 extend through strained layer 30 and into channel layer 28. Masking elements 36 are removed.

Figure 21:
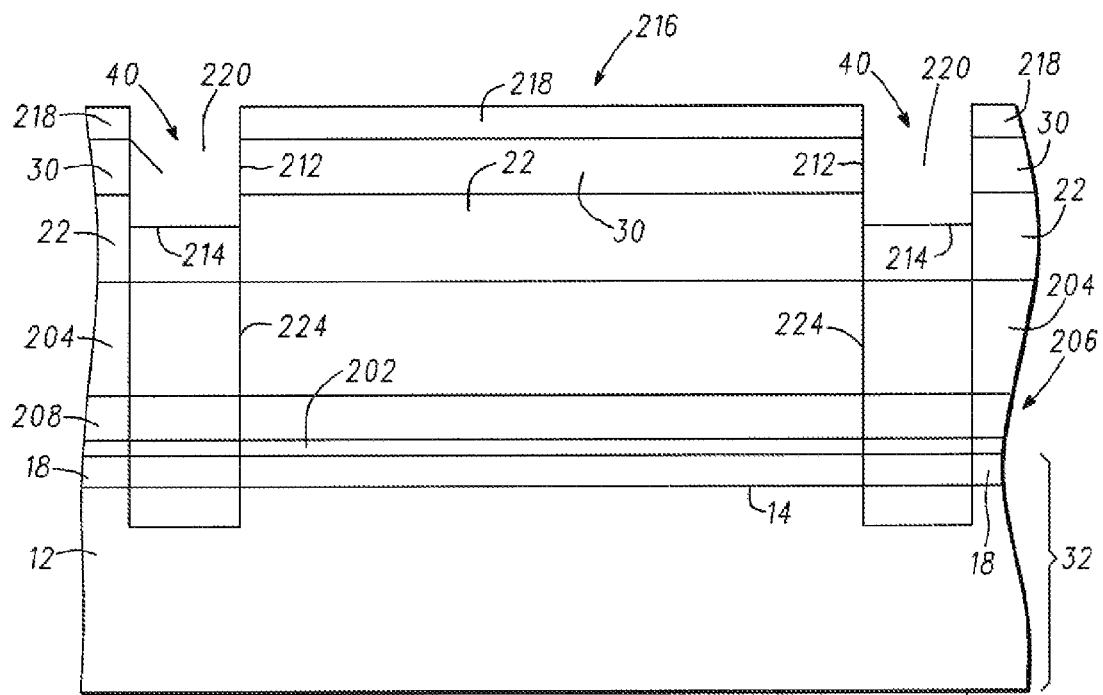
FIG. 21 is a cross-sectional view of the semiconductor component of FIG. 20 at a later stage of manufacture.

Referring now to FIG. 21, a layer of photoresist is patterned over strained layer 30 to form a masking structure 216 having masking elements 218 and openings 220 that expose portions of strained layer 30. An impurity material such as for example helium or nitrogen is implanted through openings 220 to form isolation regions 224. Masking elements 218 are removed.

Figure 22:
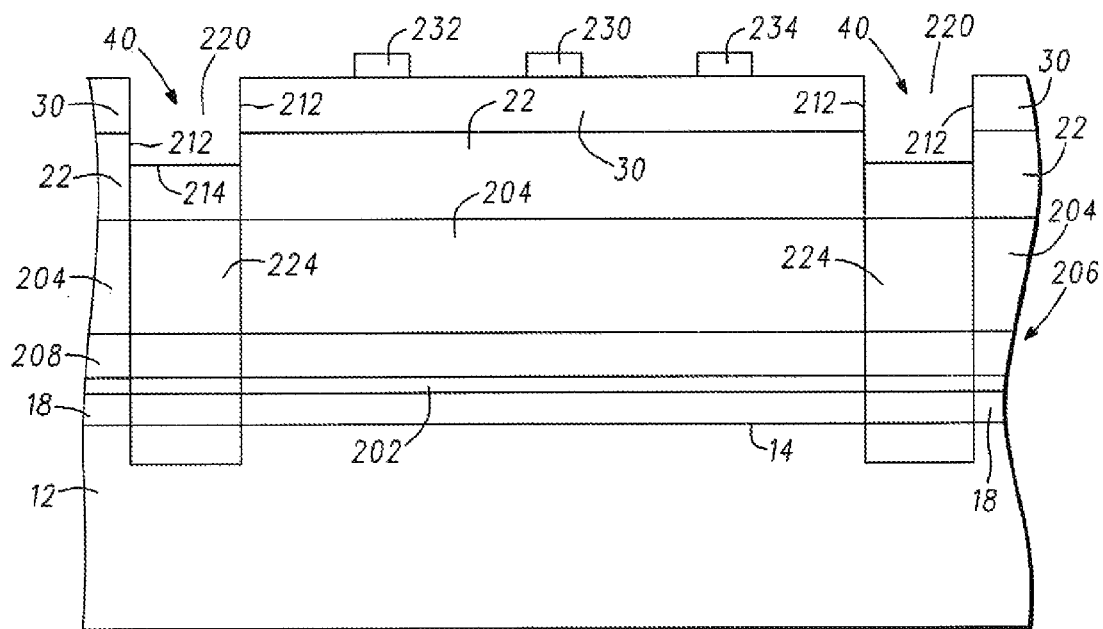
FIG. 22 is a cross-sectional view of the semiconductor component of FIG. 21 at a later stage of manufacture.

Referring now to FIG. 22, a gate electrode 230, a source electrode 232, and a drain electrode 234 are formed on portions of strained layer 30 that are between trenches 40. Thus, a III-N semiconductor device 200 having a gate electrode 230, a source electrode 232, and a drain electrode 234 is formed. By way of example, semiconductor device 200 is a HEMT semiconductor device. Thus, a III-N based semiconductor component 200 is manufactured that includes isolation regions 224. Isolation regions 224 inhibit leakage paths along the GaN/AlGaN interfaces in the bulk material from occurring, which gives better high voltage isolation. In addition, electric field stop layer 202 extends from an isolation structure 224 to an adjacent isolation structure 224, which further improves high voltage isolation.

Figure 23:
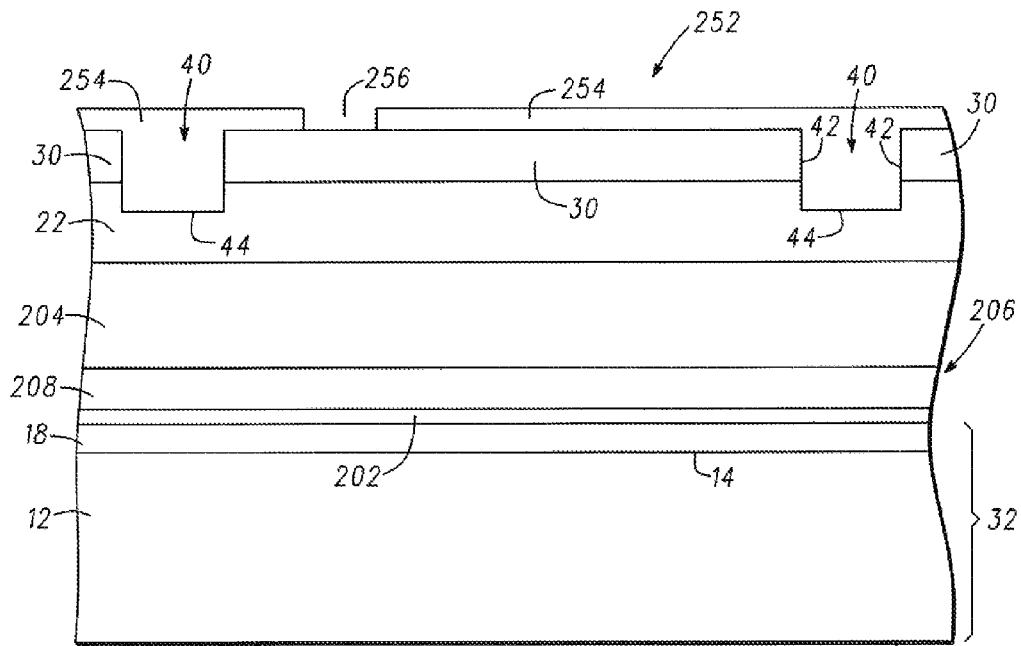
FIG. 23 is a cross-sectional view of a semiconductor component during manufacture in accordance with another embodiment of the present invention.

FIG. 23 is a cross-sectional view of a semiconductor component 250 during manufacture in accordance with another embodiment of the present invention. FIG. 23 continues from the description of FIG. 20. The reference character for the semiconductor component has been changed from 10 to 250 to distinguish the embodiment of FIG. 23 from the embodiment described with reference to FIGS. 19-22. A layer of photoresist is patterned over strained layer 30 to form a masking structure 252 having masking elements 254 and at least one opening 256 that exposes a portion of strained layer 30.

Figure 24:
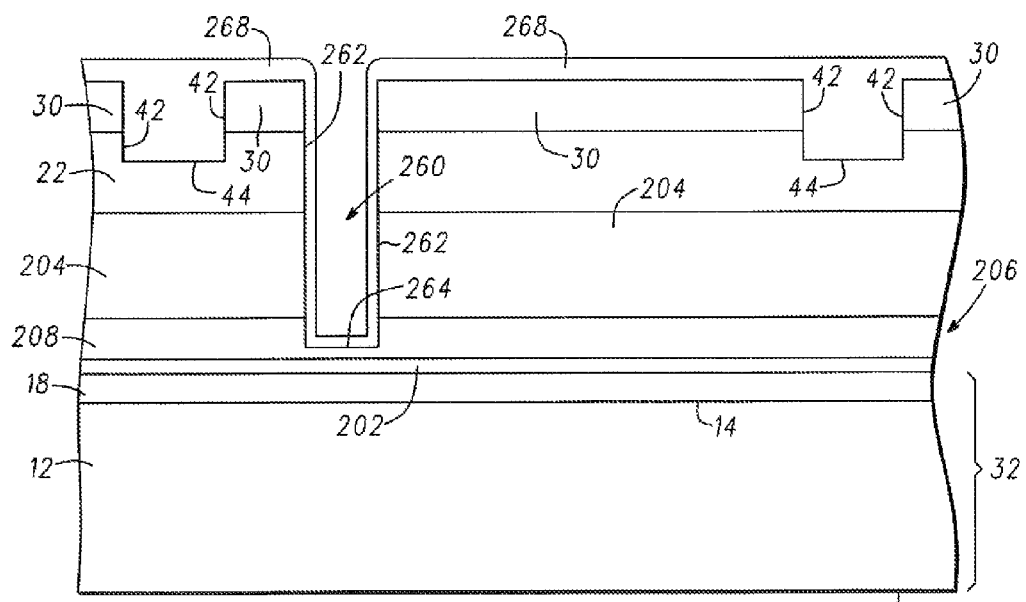
FIG. 24 is a cross-sectional view of the semiconductor component of FIG. 23 at a later stage of manufacture.

Referring now to FIG. 24, a trench 260 having sidewalls 262 and a floor 264 is formed through strained layer 30, through channel layer 22, through portion 204 of buffer layer 206, and into electric field stop layer 208. Masking elements 254 are removed and a dielectric material 268 is formed in trenches 40, on sidewalls 262 and floor 264 of trench 260, and on strained layer 30.

Figure 25:
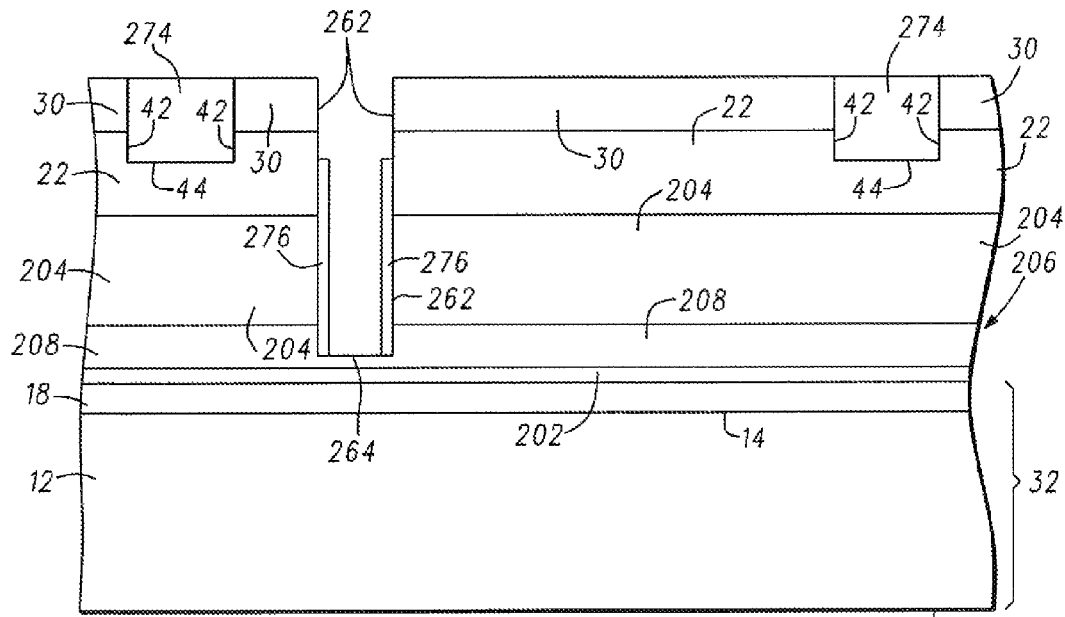
FIG. 25 is a cross-sectional view of the semiconductor component of FIG. 24 at a later stage of manufacture.

Referring now to FIG. 25, dielectric material 268 is anisotropically etched leaving portions 274 in trenches 40, portions 276 along portions of sidewalls 262, and exposing portions of strained layer 30 along sidewalls 262 and portions of channel layer 22. The anisotropic etch also exposes a surface of strained layer 30.

Figure 26:
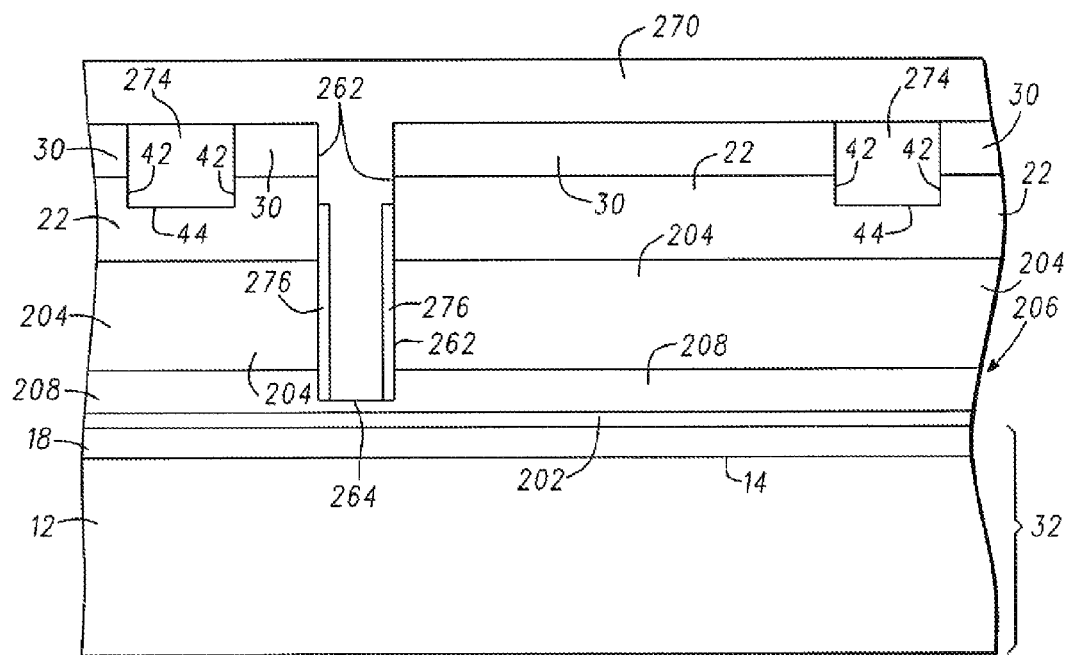
FIG. 26 is a cross-sectional view of the semiconductor component of FIG. 25 at a later stage of manufacture.

Referring now to FIG. 26, an electrically conductive material 270 is formed on portions 274 of dielectric material 268, in trench 260, along the exposed portions of sidewalls 262 adjacent to strained layer 30, along the exposed portions of sidewalls 262 adjacent to channel layer 22, and on the exposed portions of the surface of strained layer 30. In accordance with an embodiment, electrically conductive material 270 is polysilicon doped with an impurity material of the same conductivity type as substrate 12. Alternatively the material may be a metal or other electrically conductive material.

Figure 27:
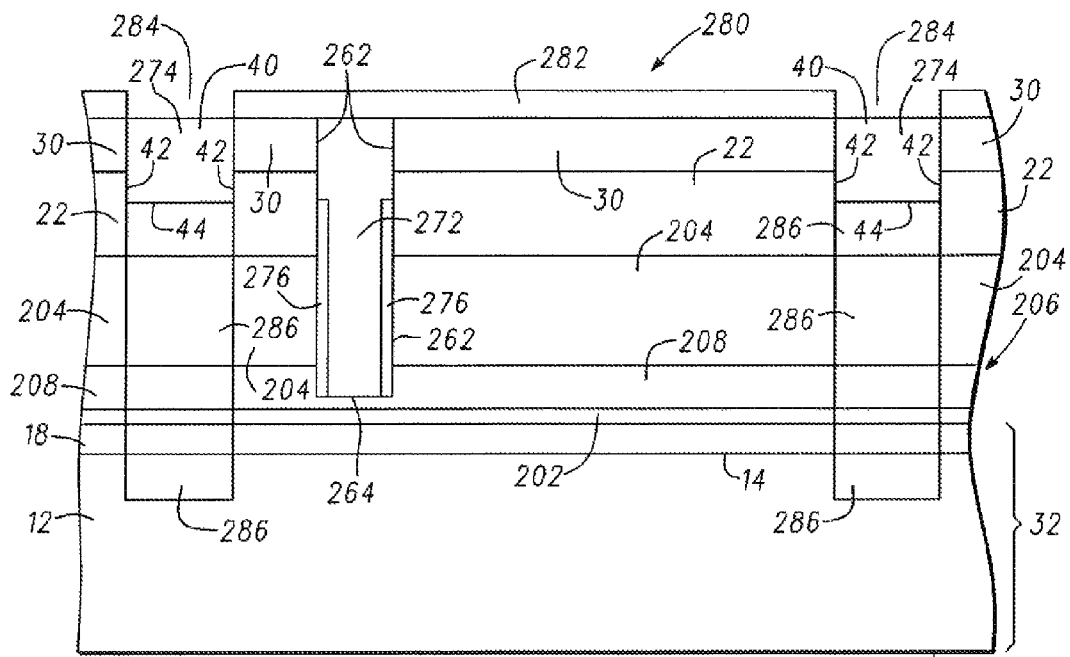
FIG. 27 is a cross-sectional view of the semiconductor component of FIG. 26 at a later stage of manufacture.

Referring now to FIG. 27, electrically conductive material 270 is planarized leaving a portion 272 of electrically conductive material 270 in trench 260, which portion is in electrical contact with strained layer 30 at sidewalls 262 and a portion is in electrical contact with channel layer 22. Sub-portions of dielectric portions 276 laterally adjacent strained layer 30 and laterally adjacent portions of channel layer 22 are removed. A layer of photoresist is patterned over strained layer 30, dielectric portions 274, electrically conductive portion 272, and dielectric portions 276 to form a masking structure 280 having masking elements 282 and openings 284 that expose portions of strained layer 30. An impurity material such as for example helium or nitrogen is implanted through openings 284 to form isolation regions 286.

Figure 28:
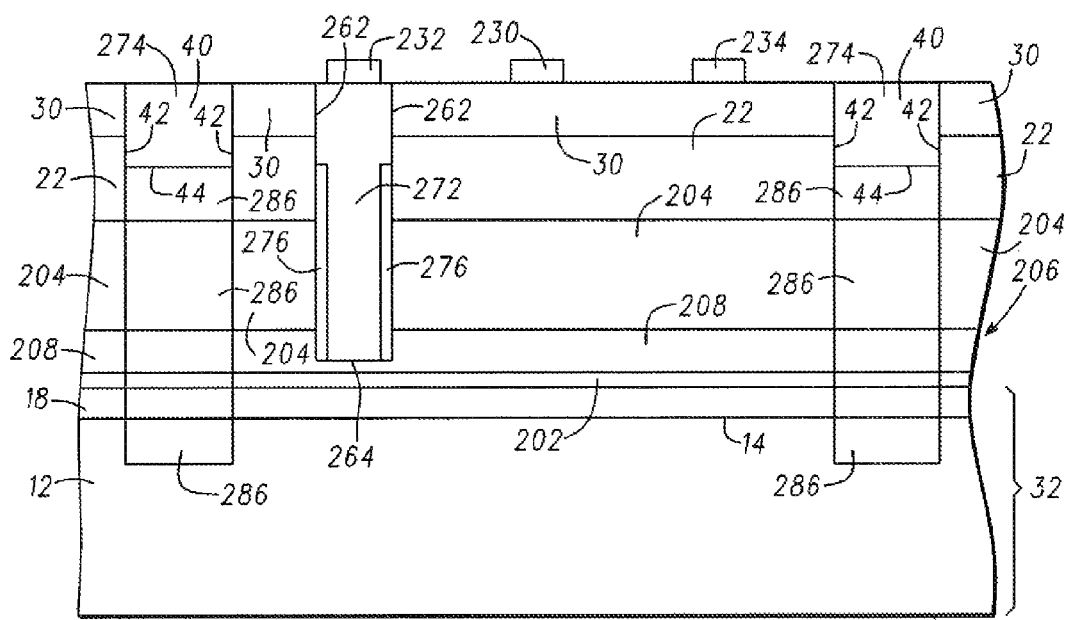
FIG. 28 is a cross-sectional view of the semiconductor component of FIG. 27 at a later stage of manufacture.

Referring now to FIG. 28, a gate electrode 230, a source electrode 232, and a drain electrode 234 are formed on portions of strained layer 30 that are between trenches 40. It should be appreciated that source electrode 234 is formed on electrically conductive portion 272. Thus, a III-N semiconductor device 250 having a gate electrode 230, a source electrode 232, and a drain electrode 234 is formed. By way of example, semiconductor device 250 is a HEMT semiconductor device.

Figure 29:
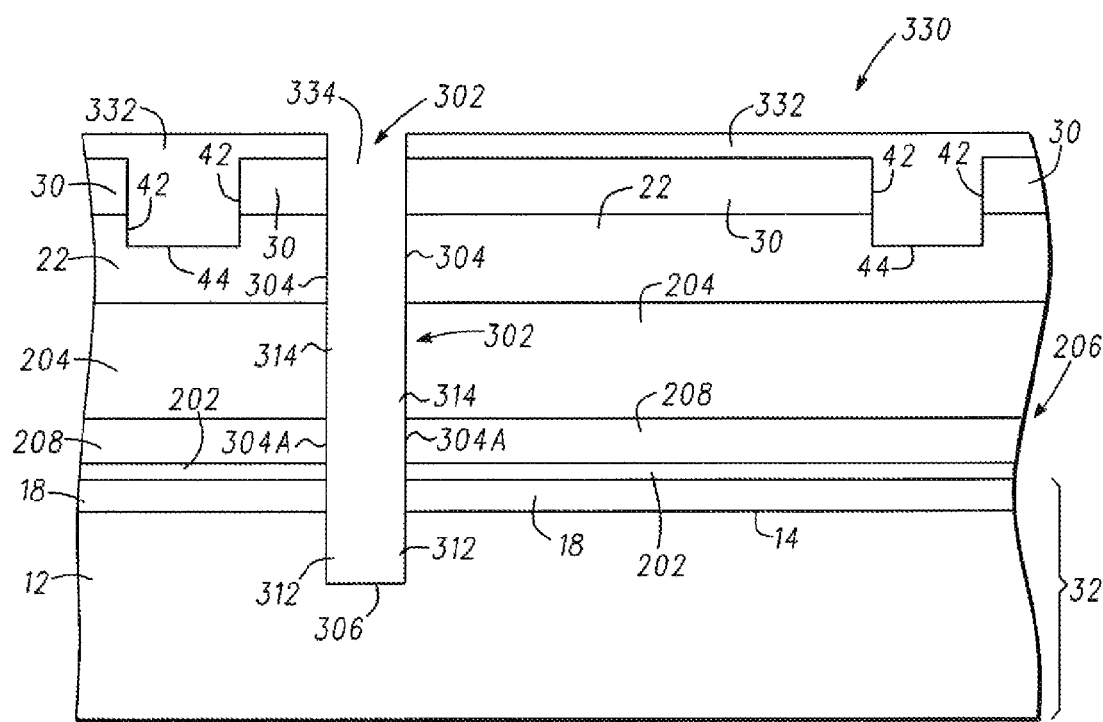
FIG. 29 is a cross-sectional view of a semiconductor component during manufacture in accordance with another embodiment of the present invention.

FIG. 29 is a cross-sectional view of a semiconductor component 300 during manufacture in accordance with another embodiment of the present invention. FIG. 29 continues from the description of FIG. 23. The reference character for the semiconductor component has been changed from 250 to 300 to distinguish between the embodiment described with reference to FIGS. 23-28. A layer of photoresist is patterned over strained layer 30 to form a masking structure 330 having masking elements 332 and openings 334 that exposes a portion of strained layer 30.

A trench 302 having sidewalls 304 and a floor 306 is formed through strained layer 30, through channel layer 22, through portion 204 of buffer layer 206, through electric stop layer 208, through portion 202 of buffer layer 206, through nucleation layer 18, and into substrate 12

Figure 30:
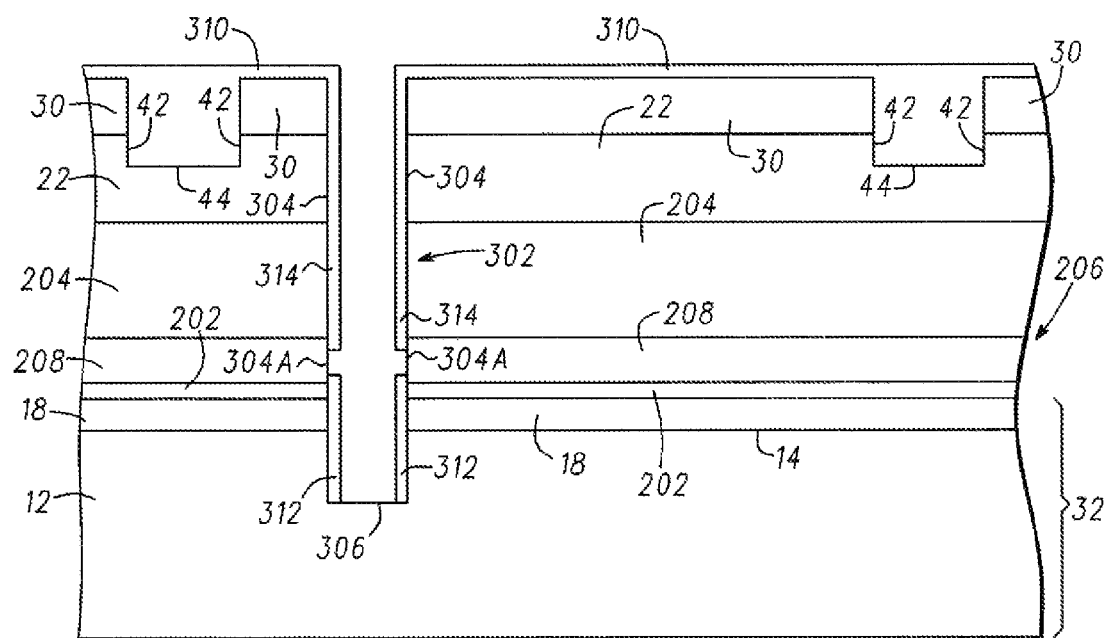
FIG. 30 is a cross-sectional view of the semiconductor component of FIG. 29 at a later stage of manufacture.

Referring now to FIG. 30, masking elements 332 are removed and a layer of dielectric material 310 is formed in trenches 302, on portions of sidewalls 304, and on strained layer 30. The process for forming dielectric layer 310 is such that portions 312 of dielectric layer 310 are formed on the portions of sidewalls 304 adjacent portion 202 of buffer layer 206 and portions 314 of dielectric material 310 are formed on the portions of sidewalls 304 adjacent portion 204 of buffer layer 206 over nucleation layer 18 and substrate 12. After formation of dielectric layer 310, portions 304A of sidewall 304 formed by electric field stop layer 208 are exposed.

Figure 31:
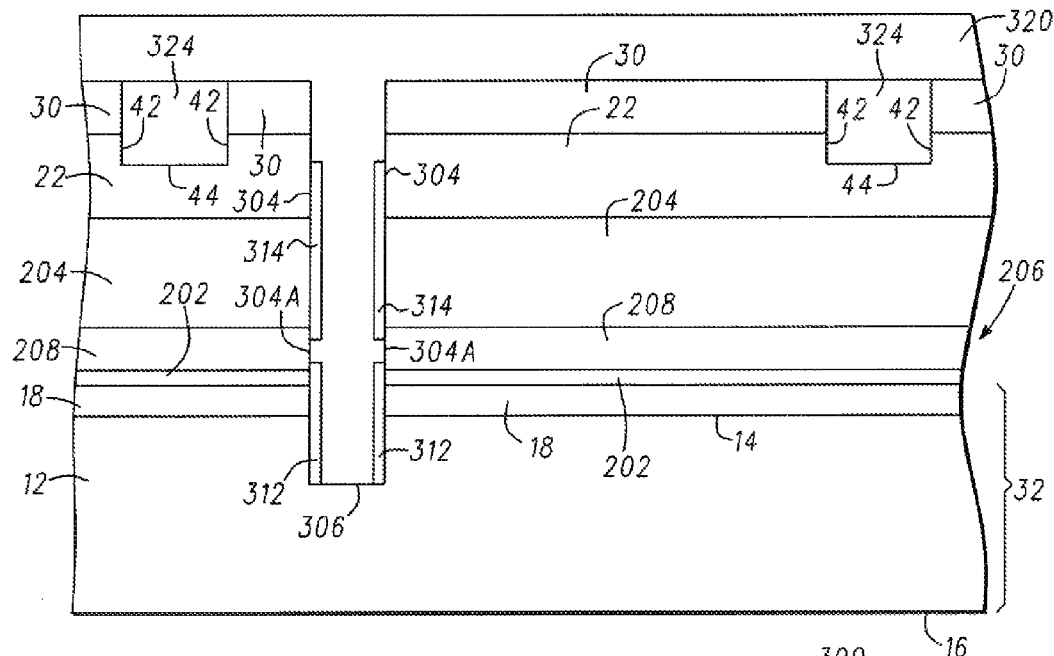
FIG. 31 is a cross-sectional view of the semiconductor component of FIG. 30 at a later stage of manufacture.

Referring now to FIG. 31, dielectric material 310 is anisotropically etched leaving portions 324 in trenches 40, portions 312 and 314 along portions of sidewalls 304, and exposing portions of strained layer 30 along sidewalls 304 and portions of electric field stop layer 208 along sidewalls 304. The anisotropic etch also exposes a surface of strained layer 30.

An electrically conductive material 320 is formed on dielectric material 310 and in trench 302, wherein electrically conductive material 320 is in electrical contact with electric field stop layer 208, channel layer 22, and strained layer 30. In accordance with an embodiment, electrically conductive material 320 is polysilicon doped with an impurity material of the same conductivity type as substrate 12. Alternatively the material may be a metal or other electrically conductive material.

Figure 32:
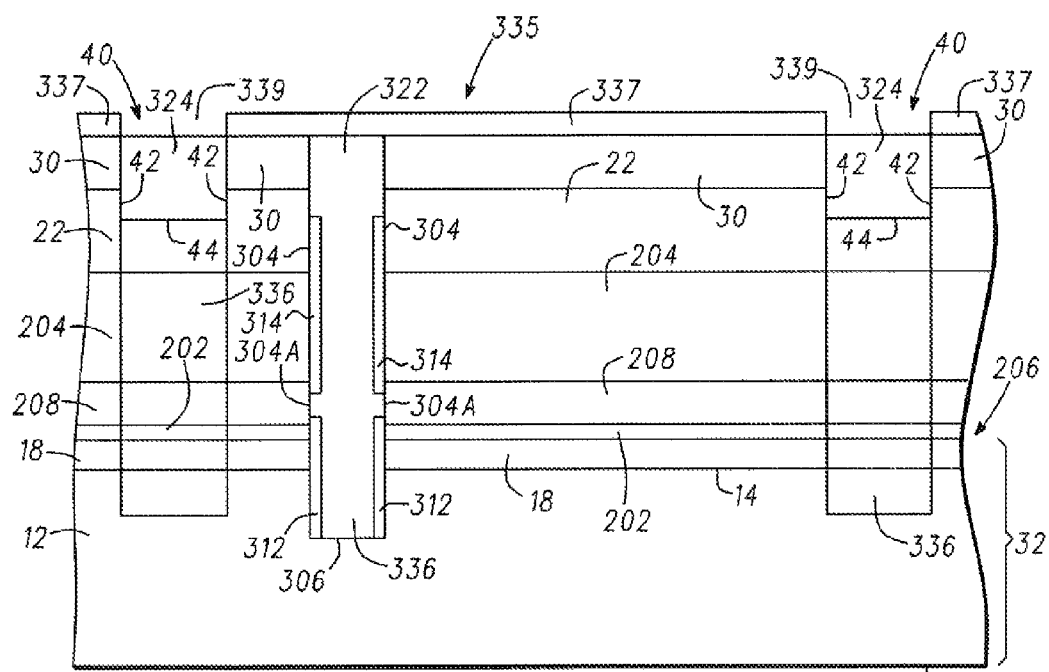
FIG. 32 is a cross-sectional view of the semiconductor component of FIG. 31 at a later stage of manufacture.

Referring now to FIG. 32, electrically conductive material 320 is planarized leaving a portion 322 of electrically conductive material 320. Portion 322 of electrically conductive material 320 electrically contacts portions of strained layer 30 and channel layer 22 adjacent to sidewalls 304. A layer of photoresist is patterned over strained layer 30, dielectric portions 324, electrically conductive portion 322, and dielectric portions 314 to form a masking structure 335 having masking elements 337 and openings 339 that expose portions of dielectric portions 324.

Still referring to FIG. 32, an impurity material such as for example helium or nitrogen is implanted through openings 334 to form isolation structures 336.

Figure 33:
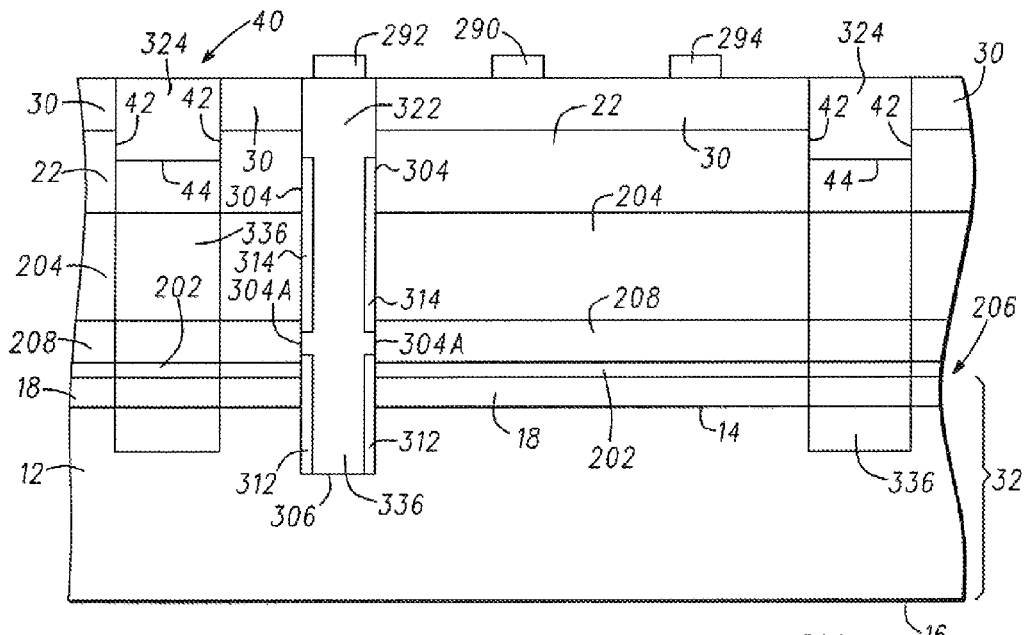
FIG. 33 is a cross-sectional view of the semiconductor component of FIG. 32 at a later stage of manufacture.

Referring now to FIG. 33, masking elements 335 are removed and a gate electrode 290 and a drain electrode 294 are formed on portions of strained layer 30 that are between trenches 40 filled with dielectric material 324 and a source electrode 292 is formed on electrically conductive portion 322. Thus, a III-N semiconductor device 300 having a gate electrode 290, a source electrode 292, and a drain electrode 294 is formed. By way of example, semiconductor device 300 is a HEMT semiconductor device.

It should be noted that electrically conductive material 322 is in electrical contact or electrical communication with electric field stop layer 208 at portions 304A of sidewalls 304, i.e., electrically conductive material 322 is in direct contact with electric field stop layer 208.

Figure 34:
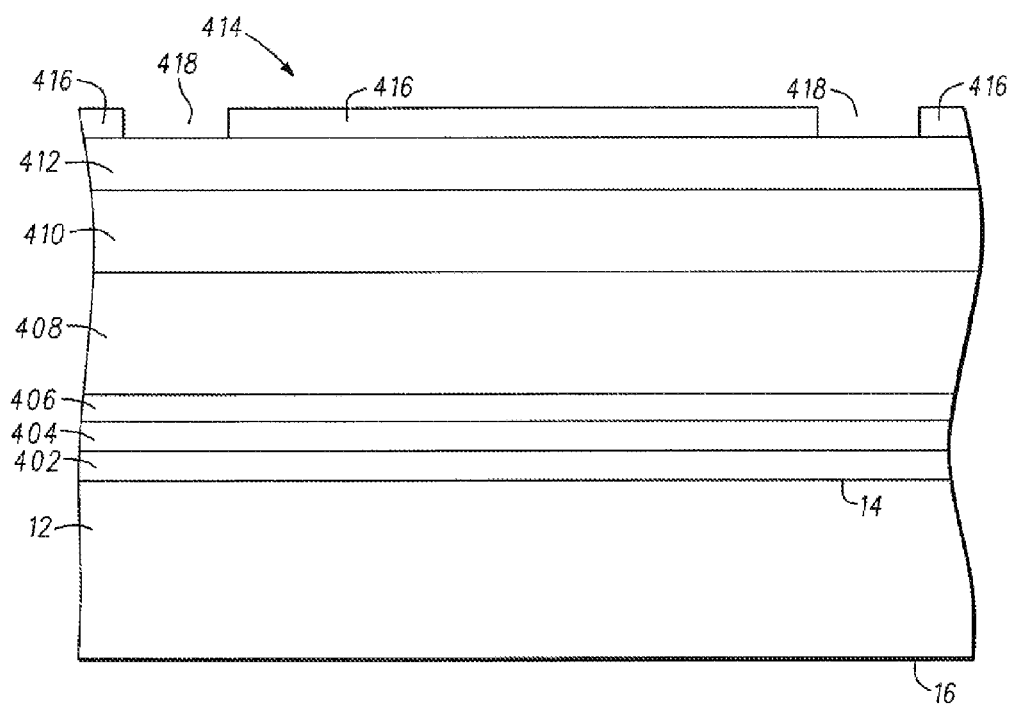
FIG. 34 is a cross-sectional view of a semiconductor component in accordance with another embodiment of the present invention.

FIG. 34 is a cross-sectional view of a semiconductor component 400 in accordance with another embodiment of the present invention. What is shown in FIG. 34 is a semiconductor substrate 12 having opposing surfaces 14 and 16. Semiconductor substrate 12 has been described with reference to FIG. 1.

In accordance with an embodiment, substrate 12 is placed in a reaction chamber and an electric field stop layer 402 having a thickness ranging from about 1 nm to about 5 μm is formed on silicon substrate 12. Electric field stop layer 402 can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like. Suitable materials for electric field stop layer 402 include Group III-N materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), a metal layer, a semi-metal layer, a material that is electrically conductive and able to make the electric field be zero or substantially zero. By way of example, electric field stop layer 402 may be a layer of highly doped gallium nitride (GaN) or a layer of highly doped aluminum gallium nitride (AlGaN) layer. Electric field stop layer 402 may be of n-type conductivity or p-type conductivity and it may have a thickness ranging from about 1 nm to about 10 um. In addition, electric field stop layer 402 may be doped with magnesium, carbon, iron, or the like.

The reactant composition of the reaction chamber is changed to form a nucleation layer 404 having a thickness ranging from about 1 nm to about 5 μm on electric field stop layer 402. By way of example, nucleation layer 404 is aluminum nitride. Other suitable materials for nucleation layer 404 include silicon and aluminum nitride, silicon carbide, aluminum gallium nitride, or the like.

The reactant composition of the reaction chamber is changed to form an electric field stop layer 406 having a thickness ranging from about 1 nm to about 10 μm on nucleation layer 404. The material of electric field stop layer 406 may be the same as those identified for electric field stop layer 402.

The reactant composition of the reaction chamber is changed to form a buffer layer 408 having a thickness ranging from about 0.1 μm to about 100 μm on electric field stop layer 406. Buffer layer 408 may be formed at a temperature ranging from about 150° C. to about 1,500° C. In accordance with an embodiment, buffer layer 408 is a layer of a III-N semiconductor material. Suitable materials for buffer layer 408 include Group III-N materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), or the like. Buffer layer 408 may be formed using MBE, PECVD, MOCVD, Metal Organic Vapor Phase Epitaxy (MOVPE), Remote Plasma Enhanced Chemical Vapor Deposition (RP-CVD), hydride vapor phase epitaxy (HVPE), liquid phase Epitaxy (LPE), Chloride Vapor Phase Epitaxy (Cl-VPE), or the like. It should be noted that buffer layer 408 may be comprised of a plurality of layers such as for example a plurality of AlN layers, a plurality of GaN layers, or alternating stacked MN and GaN layers. Buffer layer 408 may be of p-type conductivity, n-type conductivity, or it may be an intrinsic semiconductor material.

Still referring to FIG. 34, a channel layer 410 having a thickness ranging from about 0.1 μm to about 10 μm is formed on buffer layer 408 using one or more techniques selected from the group of techniques including MBE, PECVD, MOCVD, MOVPE, RP-CVD, HVPE, LPE, Cl- VPE, or the like. By way of example, channel layer 410 is a GaN layer having a thickness ranging from about 0.5 µm to about 7.5 µm.

A strained layer 412 having a thickness ranging from about 10 nanometers (nm) to about 1,000 nm is formed on channel layer 410 using one or more techniques selected from the group of techniques including MBE, PECVD, MOCVD, MOVPE, RP-CVD, HVPE, LPE, Cl-VPE, or the like. By way of example, strained layer 412 is an AlGaN layer having a thickness ranging from about 10 nm to about 100 nm.

A layer of photoresist is patterned over strained layer 412 to form a masking structure 414 having masking elements 416 and openings 418 that expose portions of strained layer 412.

Figure 35:
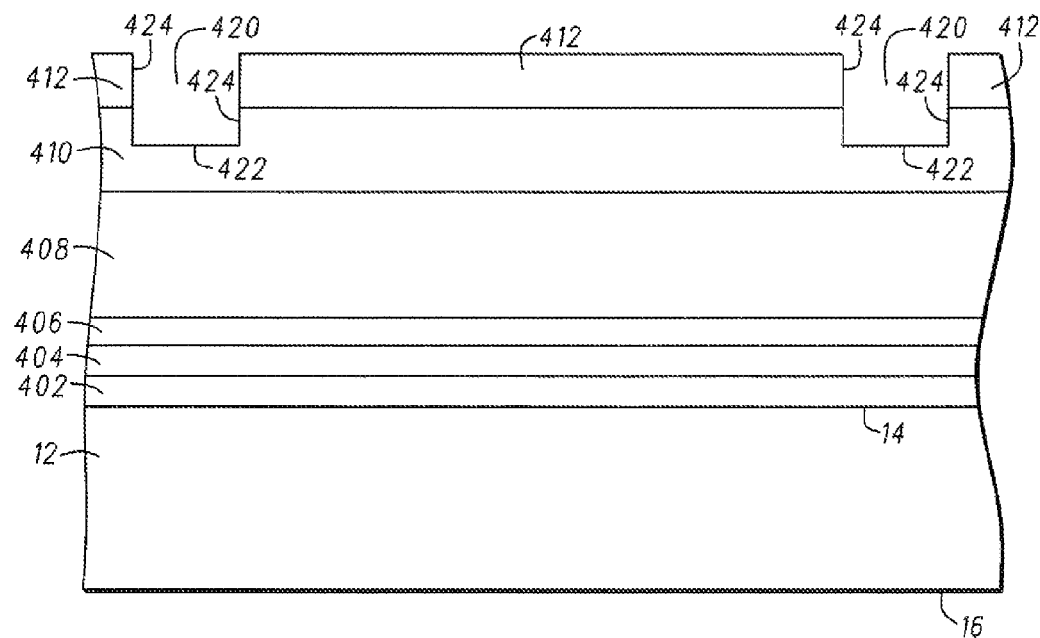
FIG. 35 is a cross-sectional view of the semiconductor component of FIG. 34 at a later stage of manufacture.

Referring now to FIG. 35, trenches 420 having floors 422 and sidewalls 424 are formed in the portions of semiconductor material exposed by openings 418 using, for example, a dry etching technique. In accordance with an embodiment, trenches 420 extend through strained layer 412 and into channel layer 410. Masking elements 416 are removed.

Figure 36:
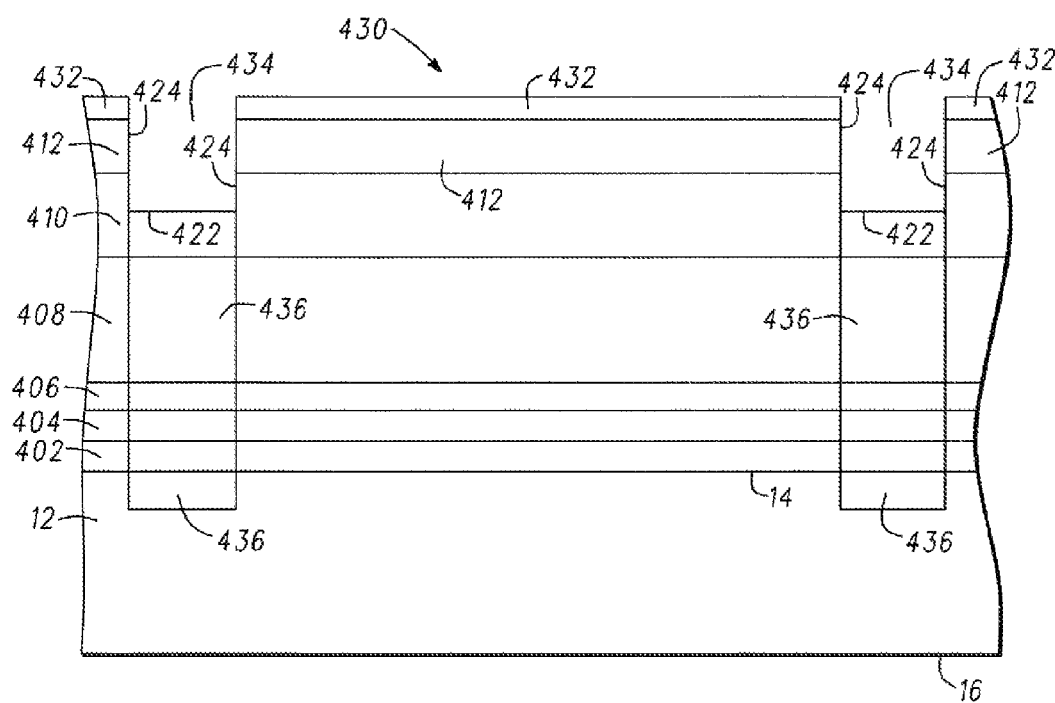
FIG. 36 is a cross-sectional view of the semiconductor component of FIG. 35 at a later stage of manufacture.

Referring now to FIG. 36, a layer of photoresist is patterned over strained layer 30 to form a masking structure 430 having masking elements 432 and openings 434 that expose portions of strained layer 412. An impurity material such as for example helium or nitrogen is implanted through openings 434 to form isolation regions 436.

Figure 37:
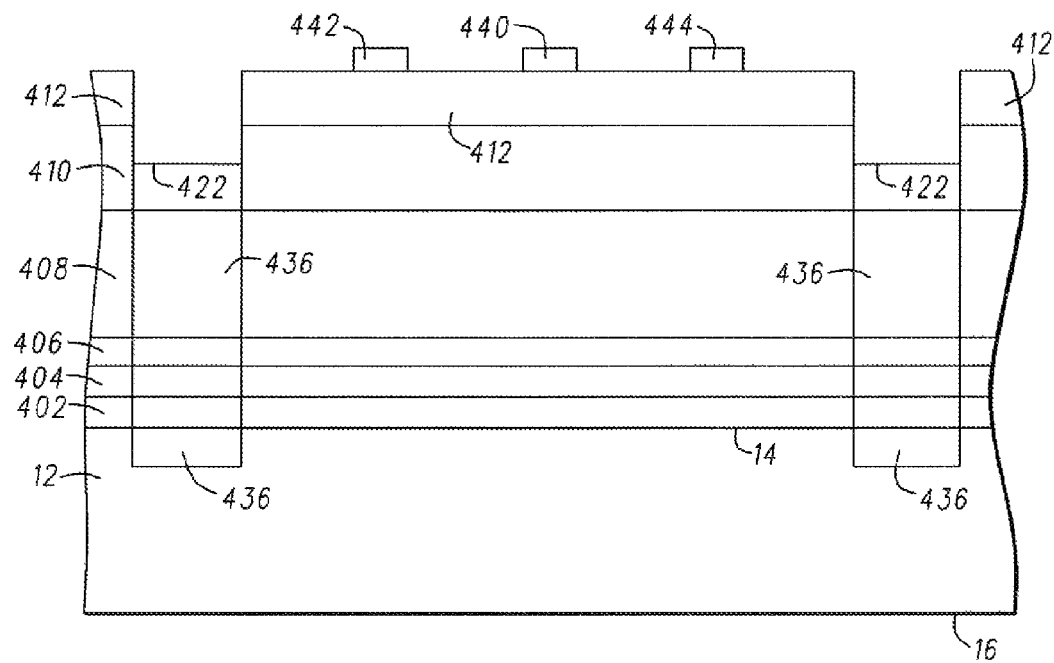
FIG. 37 is a cross-sectional view of the semiconductor component of FIG. 36 at a later stage of manufacture.

Referring now to FIG. 37, masking elements 432 are removed and a gate electrode 440, a source electrode 442, and a drain electrode 444 are formed on portions of strained layer 412 that are between trenches 420.

By now it should be appreciated that III-N semiconductor component that includes field trenches in combination with an electric field stop layer and a method for manufacturing the III-N semiconductor component have been provided. Integrating the electric field stop layer with the electric field trenches inhibits leakage path formation at the interfaces of different III-N semiconductor materials, e.g., at an interface between gallium nitride layers and aluminum gallium nitride layers (a GaN/AlGaN interface). This lowers the electric field strength which increases breakdown voltages. In addition, integrating the electric field stop layer the electric field trenches allows formation of thinner layers to III-N materials while maintaining a high breakdown voltage, which lowers the costs of the III-N based semiconductor devices.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
   providing a semiconductor material having a surface;
   forming a nucleation layer on the semiconductor material;
   forming a first portion of a buffer layer on the nucleation layer;
   forming an electric field stop layer on the first portion of the buffer layer;
   forming a second portion of the buffer layer on the electric field stop layer;
   forming a plurality of trenches, wherein each trench extends through the second portion of the buffer layer, through the electric field stop layer, through the first portion of the buffer layer, and into the semiconductor material, and wherein each trench has a floor and opposing sidewalls;
   forming a layer of insulating material on at least the opposing sidewalls of a first trench of the plurality of trenches and on the opposing sidewalls of a second trench of the plurality of trenches; and
   forming a trench fill material in the first trench and in the second trench,
   wherein the first portion of the buffer layer comprises graded superlattice and a doping concentration of the field stop layer is higher than a doping concentration of the second portion of the buffer layer.

2. The method of claim 1, further including forming the electric field stop layer to be in contact with the first portion of the buffer layer and forming the second portion of the buffer layer to be in contact with the electric field stop layer.

3. The method of claim 1, wherein forming the layer of insulating material on the opposing sidewalls of the first trench and on the opposing sidewalls of the second trench includes forming one of aluminum nitride or silicon nitride on the opposing sidewalls of the first trench and on the opposing sidewalls of the second trench.

4. The method of claim 3, wherein forming the trench fill material in the first trench and in the second trench includes forming one of an electrically conductive material or an electrically insulating material in the first trench and in the second trench.

5. The method of claim 4, further including forming the layer of insulating material on the floor of the second trench of the plurality of trenches, wherein forming the trench fill material in the first trench and in the second trench includes forming the electrically conductive material in the first trench to contact the semiconductor material, wherein the electrically conductive material in the second trench is electrically isolated from the semiconductor material.

6. The method of claim 1, further including forming the layer of insulating material on the floor of the first trench and on the floor of the second trench.

7. The method of claim 6, wherein forming the layer of insulating material on the floors and on the opposing sidewalls of the first trench and the second trench includes forming one of aluminum nitride or silicon nitride on the floors and on the opposing sidewalls of the first trench and the second trench.

8. The method of claim 1, further including forming a channel layer on the second portion of the buffer layer, forming a strained layer on the channel layer, forming a control electrode and first and second current carrying electrodes over the strained layer and forming an electrical interconnect between one of the first current carrying electrode or the second current carrying electrode and the trench fill material in the first trench.

9. A method for manufacturing a semiconductor component, comprising:
   providing a semiconductor material;
   forming a nucleation layer on the semiconductor material;
   forming a first portion of a buffer layer on the nucleation layer;
   forming an electric field stop layer on the first portion of the buffer layer;
   forming a second portion of the buffer layer on the electric field stop layer;
   forming a channel layer on the second portion of the buffer layer;
   forming a strained layer on the channel layer;

forming a first isolation structure extending through the strained layer, into the channel layer, through the second portion of the buffer layer, the electric field stop layer, the first portion of the buffer layer, and the nucleation layer;

forming a second isolation structure extending through the strained layer, into the channel layer, through the second portion of the buffer layer, the electric field stop layer, the first portion of the buffer layer, and the nucleation layer; and forming a control electrode and a first current carrying electrode over the portion of the strained layer that is between the first isolation structure and the second isolation structure, wherein the first portion of the buffer layer comprises graded superlattice and a doping concentration of the field stop layer is higher than a doping concentration of the second portion of the buffer layer.

10. The method of claim 9, wherein forming the first portion of the buffer layer includes forming the first portion of the buffer layer using a first reactant composition, forming the electric field stop layer includes using a second reactant composition, and forming the second portion of the buffer layer using a third reactant composition.

11. The method of claim 9, further including forming the electric field stop layer between and in contact with the first portion of the buffer layer and the second portion of the buffer layer.

12. The method of claim 1, further including forming a channel layer on the second portion of the buffer layer.

* * * * *